United States Patent [19]

Nakao et al.

[11] Patent Number: 5,599,413
[45] Date of Patent: Feb. 4, 1997

[54] METHOD OF PRODUCING A CERAMIC ELECTRONIC DEVICE

[75] Inventors: Keiichi Nakao, Kyoto; Noboru Mohri, Katano, both of Japan

[73] Assignee: Matsushita Electric Industrial Co., Ltd., Osaka, Japan

[21] Appl. No.: 157,642

[22] Filed: Nov. 24, 1993

[30] Foreign Application Priority Data

Nov. 25, 1992 [JP] Japan ..................... 4-314730

[51] Int. Cl.⁶ .............. B32B 31/18; B32B 31/26
[52] U.S. Cl. ................. 156/89; 156/253; 264/3.1; 264/61
[58] Field of Search ............... 156/89, 252, 253, 156/272.8; 264/61, 67, 25; 174/262, 266

[56] References Cited

U.S. PATENT DOCUMENTS

| | | | |
|---|---|---|---|
| 3,102,213 | 8/1963 | Bedson et al. | 174/266 |
| 3,541,223 | 11/1970 | Helms | 174/262 |
| 3,742,182 | 6/1973 | Saunders | 156/155 X |
| 3,770,529 | 11/1973 | Anderson . | |
| 3,948,706 | 4/1976 | Schmeckenbecher | 156/155 X |
| 3,956,052 | 5/1976 | Koste et al. | 156/272.2 X |
| 4,258,468 | 3/1981 | Balde | 174/266 X |
| 4,497,677 | 2/1985 | Sanada et al. . | |
| 4,681,656 | 7/1987 | Byrum . | |
| 4,766,671 | 8/1988 | Utsumi et al. . | |
| 4,799,983 | 1/1989 | Desai | 156/89 |
| 4,821,007 | 4/1989 | Fields et al. | 174/266 X |
| 5,140,745 | 8/1992 | McKenzie, Jr. | 174/266 X |
| 5,276,963 | 1/1994 | Flanders | 264/61 X |

FOREIGN PATENT DOCUMENTS

| | | |
|---|---|---|
| 165575 | 12/1985 | European Pat. Off. . |
| 484731 | 5/1992 | European Pat. Off. . |
| 4-225297 | 8/1992 | Japan . |
| 84/01470 | 4/1984 | WIPO . |
| 88/08360 | 11/1988 | WIPO . |

OTHER PUBLICATIONS

Richerson, D. W., "Final Machining" in Modern Ceramic Engineering, 1992, pp. 596–602.
Search report dated Nov. 2, 1994.

Primary Examiner—David A. Simmons
Assistant Examiner—M. Curtis Mayes
Attorney, Agent, or Firm—Ratner & Prestia

[57] ABSTRACT

For minimizing the size of a ceramic electronic device for elimination of noise in a digital circuit installed in an electric apparatus, a method comprises the steps of placing a ceramic layers structure encapsulating internal electrodes on a substrate which has a plurality of apertures arranged therein, making through holes in the ceramic layers structure by applying a sand blasting through the apertures of the substrate, and forming in the through holes external electrodes connected to the internal electrodes.

4 Claims, 37 Drawing Sheets

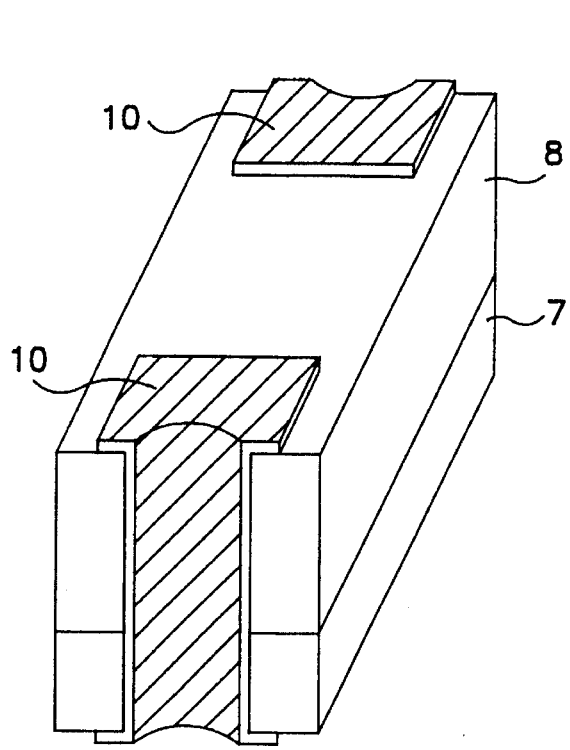
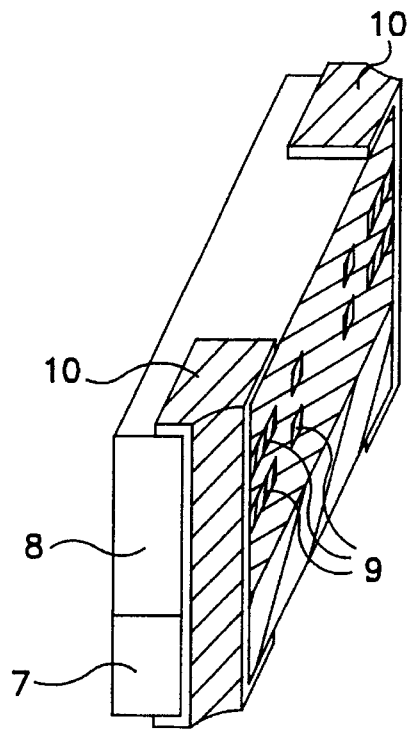
FIG. 1    FIG. 2
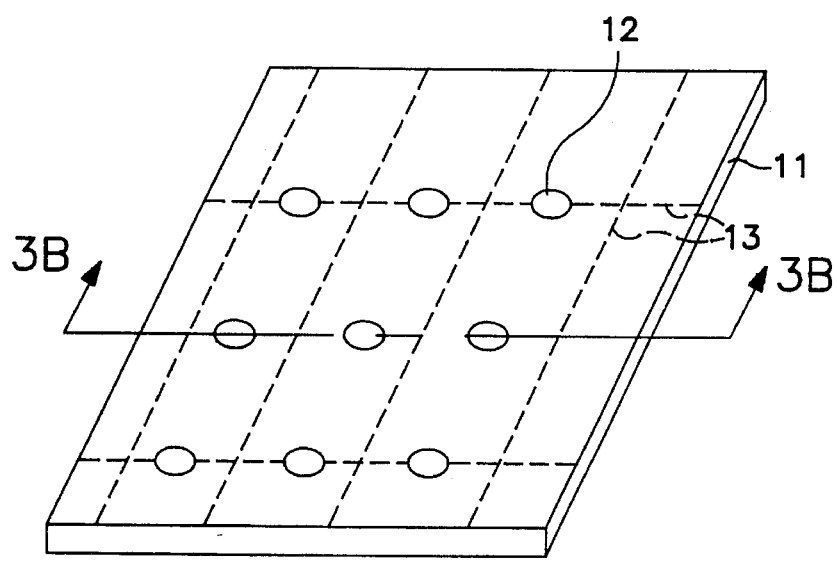
FIG. 3A
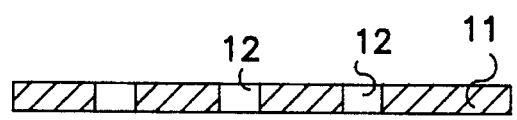
FIG. 3B

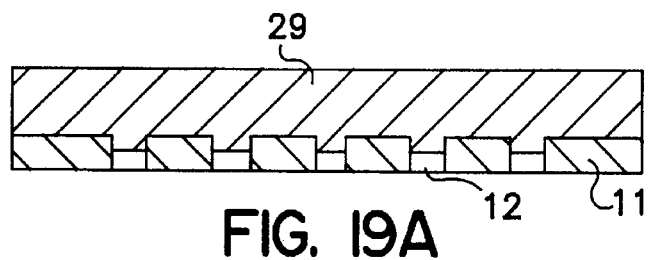
FIG. 19A
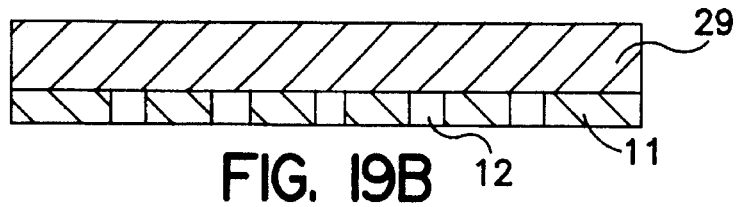
FIG. 19B
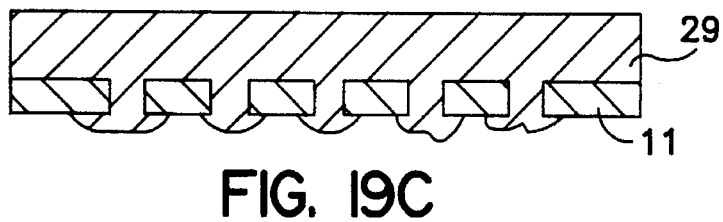
FIG. 19C
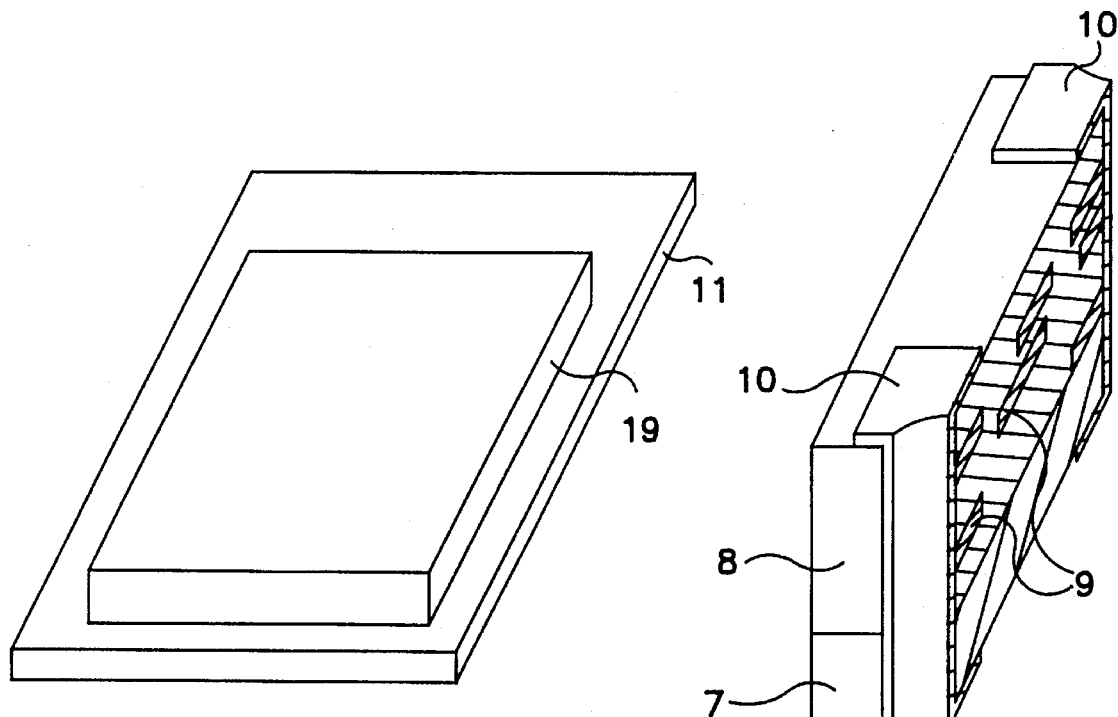
FIG. 20
FIG. 21

1

METHOD OF PRODUCING A CERAMIC ELECTRONIC DEVICE

BACKGROUND OF THE INVENTION

1. Field of the Invention

The present invention relates to a ceramic electronic device and its producing method and more specifically, to advanced ceramic devices including a filter for eliminating noise in a digital circuit, a high-brid IC, a multi-layer device, a printed circuit tip, and an arrayed thick-film device such as a high-frequency filter, and their producing methods.

2. Description of the Prior Art

For producing tip-type or array-type ceramic electrode devices of smaller size and higher quality including a high-brid IC, a multi-layer ceramic device, a printed circuit tip, and a composite thick-film device such as a filter, a process has been introduced in which the internal electrodes are built in multiple layers by layer printing and connected via through or bare holes to the external electrodes which are formed by through-hole printing.

The conventional process will be described referring to FIGS. 53 to 55 in which external electrodes are formed by through-hole printing in the apertures arranged in a ceramic substrate for producing a given number of array-type tip resistors. FIG. 53 is a perspective view of an array-type tip resistor in which provided are a ceramic base 1a, resistors 2, electrode extensions 3, and external electrodes 4. The electrode extensions 3 are formed by printing on the resistors 4 and connected to the external electrodes 4 formed by through-hole printing.

FIG. 54 is a perspective view explaining a step of the conventional process in which the resistors 2 are distributed on a ceramic substrate 1b. The ceramic substrate 1b is provided with a given pattern of score lines 5 and rows of apertures 6 extending across and along the score lines 5.

FIG. 55 is a perspective view of showing another step of the process in which the electrode extensions 3 coupled to the resistors 2 allocated at the step of FIG. 54. More particularly, a material ink of the electrode extension 3 is printed between the two adjacent resistors 2, 2 and before the ink is dried, its portion is drawn in by suction through the aperture 6 from the below of the ceramic substrate 1b so that the electrode extension 3 is elongated. Hence, the inner wall of the aperture 6 of the ceramic substrate 1b is covered with a uniform thickness of the electrode extension 3 (as the result of the through-hole printing).

The ceramic substrate 1b having the electrode extensions 3 of the electrode ink extending in its apertures 6 and connected to the resistors 2 is baked at a given temperature and cut along the score lines 5 into the array-type tip resistors shown in FIG. 53. At the time, the electrode ink material distributed into each aperture 6 is also separated into two and becomes the external electrode 4 of the array-type tip resistor as shown in FIG. 53.

This through-hole printing technique has widely be used for production of common or high-brid circuit boards. Also, a variety of processes have been developed for carrying out the application or distribution of material ink to the inner wall of the apertures, As described previously, each aperture 6 of the ceramic substrate 1b has to spare a margin of unoccupied surface around its location when it is used for implementation of the through-hole printing of an electrode material ink by suction or to accept the external electrode 4 printed down. This restricts the arrangement of other circuits close to and about the aperture 5. When multi-layer ceramic circuits are disposed on a ceramic substrate 1b, no external electrode can be built by the through-hole printing without giving a specific protection.

More particularly, when a dielectric or magnetic material is distributed next to the aperture of the ceramic substrate, its portion tends to flow into the aperture and reduce the cross area of the same or if worse, close up the aperture. As the result, when a stream of air is developed by suction in the aperture for the through-printing, its velocity varies due to ununiformity of the cross area causing a dope of the ink to run irregularly. This results in undulation of the coating of the ink on the inner wall of the aperture. Thus, it hardly is possible to apply or impress any other material close to the apertures on the ceramic substrate when the apertures of the ceramic substrate are used for implementation of the through-hole printing or to accept the external electrodes printed down. Accordingly, it will be difficult to reduce the size of the ceramic electronic device produced by placing a ceramic layers structure on such a ceramic substrate using the conventional process.

SUMMARY OF THE INVENTION

It is an object of the present invention, for elimination of the above disadvantage, to provide a ceramic electrode device capable of being downsized and a method of producing the same.

For the purpose, a method of producing according to the present invention comprises the steps of placing green-form ceramic layers encapsulating internal electrodes one over the other on a substrate which has a plurality of apertures arranged therein so that the internal electrodes are seated on their corresponding apertures of the substrate, making multiple through holes in a structure of the green-form ceramic layers through the apertures of the substrate, forming external electrodes connected to the internal electrodes in the through holes extending from the substrate to the green-form ceramic layers structure, and after baking, dividing the ceramic layers structure into pieces so that the external electrodes appear on the sides of each piece.

Also, another method according to the present invention comprises the steps of placing green-form ceramic layers encapsulating internal electrodes one over the other on a substrate which has a plurality of apertures arranged therein so that the internal electrodes are seated on their corresponding apertures of the substrate, making multiple through holes in a structure of the green-form ceramic layers using the substrate as a masking, dividing the green-form ceramic structure into pieces along the lines which extends across and along the through holes, forming external electrodes between the through holes on the green-form ceramic layers structure, and baking the green-form ceramic layers structure.

It is possible to divide the ceramic layers structure into pieces with or without the substrate. The removal of the ceramic layers structure from the substrate may be implemented before or after the baking of its green form.

For the purpose, a ceramic electronic device according to the present invention comprises internal electrodes, a multi-layer ceramic block mounted on a base, and external electrodes extending from apertures in the base to through holes in the multi-layer ceramic block to connect to the internal electrodes.

BRIEF DESCRIPTION OF THE DRAWINGS

FIG. 1 is a perspective view of a tip-type noise filter produced by a ceramic electronic device producing method of the present invention showing Example 1;

FIG. 2 is a cross-sectional perspective view of the tip-type noise filter shown in FIG. 1;

FIGS. 3(A) and 3(B) illustrate a perspective view and its 3B—3B cross-sectional view explaining a step of the method of producing the tip-type noise filter of Example 1;

FIGS. 19(A)–19(C) are cross-sectional view explaining a step of printing layers with a ceramic ink directly on a ceramic substrate to form a green-form ceramic layers structure of Example 1;

FIG. 20 is a perspective view of the green-form ceramic layers structure of Example 1;

FIG. 21 is a cross-sectional view of another form of the tip-type noise filter of Example 1;

DESCRIPTION OF THE PREFERRED EMBODIMENTS

EXAMPLE 1

Figure 4A:
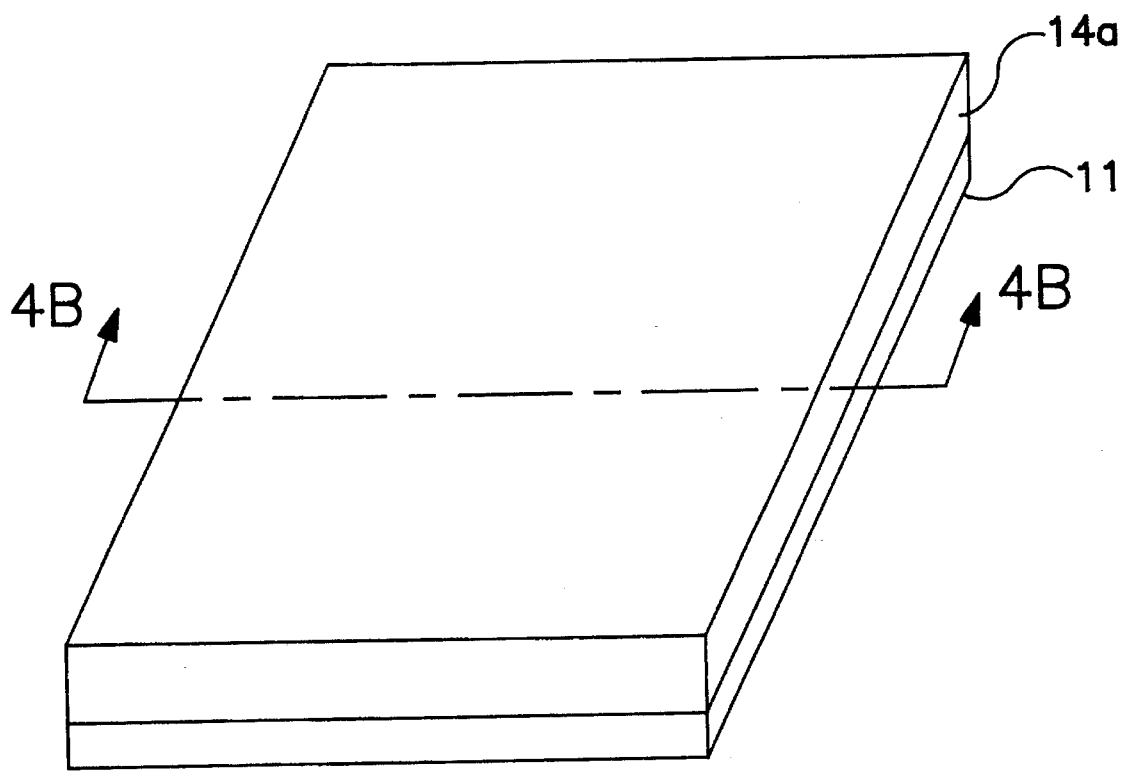
FIGS. 4(A) and 4(B) illustrate a perspective view and its 4B—4B cross-sectional view explaining another step of the same.

Example 1 according to a method of the present invention will be described referring to the accompanying drawings.

FIG. 1 is an external perspective view of a ceramic electronic device or namely, tip-type noise filter which is produced by the method of the present invention showing Example 1. FIG. 2 is a cross sectional perspective view showing a vertical cross section of the noise filter of FIG. 1. As shown in FIGS. 1 and 2, there are provided a ceramic base 7 serving as a support member and a ceramic layers block 8 mounted to the upper surface of the ceramic base 7. The ceramic base 7 and the ceramic layers block 8 are shaped identical to each other in the horizontal cross area. The ceramic layers block 8 is made of glass ferrite and has an internal electrode 9 of a spiral or coil shape encapsulated therein. The internal electrode 9 encapsulated in the ceramic layers block 8 is connected at both ends to external electrodes 10 which are disposed at both ends of the filter unit consisting of the ceramic base 7 and the ceramic layers block 8.

The method of producing the foregoing tip-type noise filter will be explained referring to FIGS. 3 to 18.

At a first step of the method, the base member of the noise filter is formed from an alumina ceramic plate. The ceramic substrate is formed to a four-sided shape of 80 mm× 60 mm as denoted by 11 in FIG. 3(A) and 3(B), having a matrix of apertures 12 of 0.3 mm in diameter arranged therein at equal intervals of a pitch of 1.27 mm. FIG. 3(B) is a cross sectional view taken along the line 3B—3B of FIG. 3(A).

The apertures 12 have systematically been created during molding of the ceramic substrate 11. The dotted lines denoted by 13 in FIG. 3(A) represent score lines provided on the upper surface of the ceramic substrate 11 also in the molding or by laser cutting for ease of separating the ceramic substrate 11 into a predetermined number of the tip-type ceramic filters shown in FIG. 1. The score lines 13 have a depth equal to 20% to 50% the thickness of the ceramic substrate 11 so that the ceramic substrate 11 can easily be cut apart by an applicable cutter or by hand.

Figure 4B:
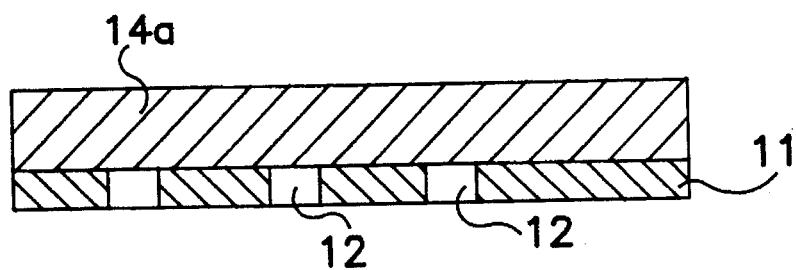

FIGS. 4(A) and 4(B) illustrate the succeeding step in which the ceramic substrate 11 provided with the apertures 12 is covered at the upper surface with a lower green-form ceramic layer 14a of 0.4 mm thick so that the apertures 12 of the ceramic substrate 11 are closed. More particularly, the lower green-form ceramic layer 14a is formed on the ceramic substrate 11 by thermocompression or hot transfer bonding of a given number of green-form ceramic sheets placed one over the other to a thickness. The green-form ceramic sheets for the tip-type noise filter of the present invention were prepared from a ferrite material. The ferrite material was mixed with a glass additive added as a sinrazing agent, calcined, and milled thus producing a glass ferrite powder. The glass ferrite powder was then suspended in a solution to form a ceramic slurry (ceramic ink). The ceramic slurry was applied onto a base sheet by a coater and after drying, the ceramic sheet was produced.

Figure 5A:
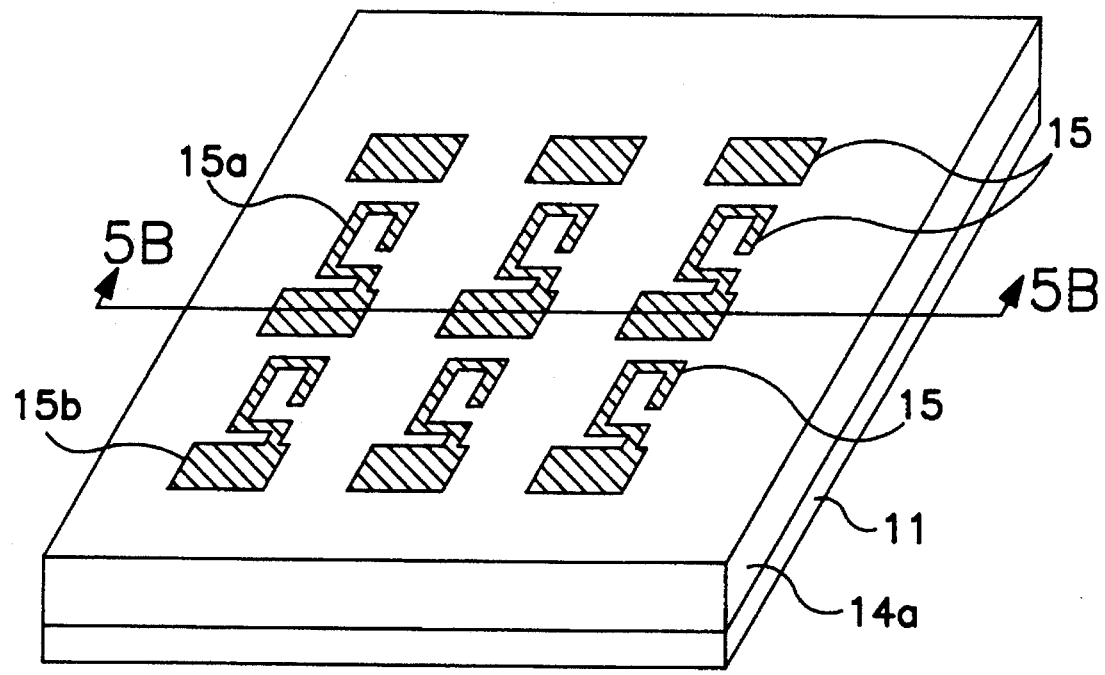
FIG. 5(A) illustrates a perspective view and its 5B—5B cross-sectional view explaining a further step of the same.
Figure 5B:
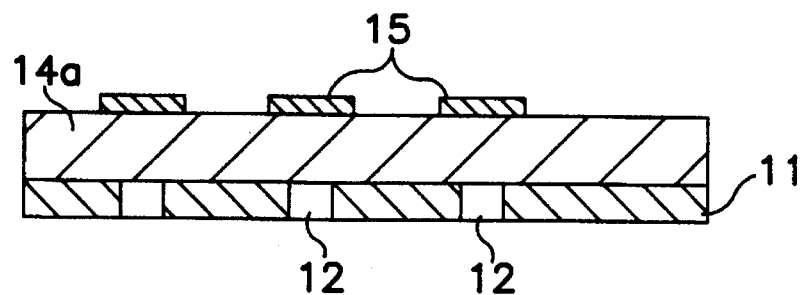
FIG. 5(B) illustrates a perspective view and its cross-sectional view explaining a still further step of the same.

FIGS. 5(A) and 5(B) show a third step in which a pattern of silver palladium ink is printed on the lower green-form ceramic layer 14a to form internal electrode segments 15. As shown, the internal electrode segment 15 has two different portions; a narrow portion 15a makes a part of the coil form and a wide portion 15b serves as a connector to the external electrode 10.

Figure 6A:
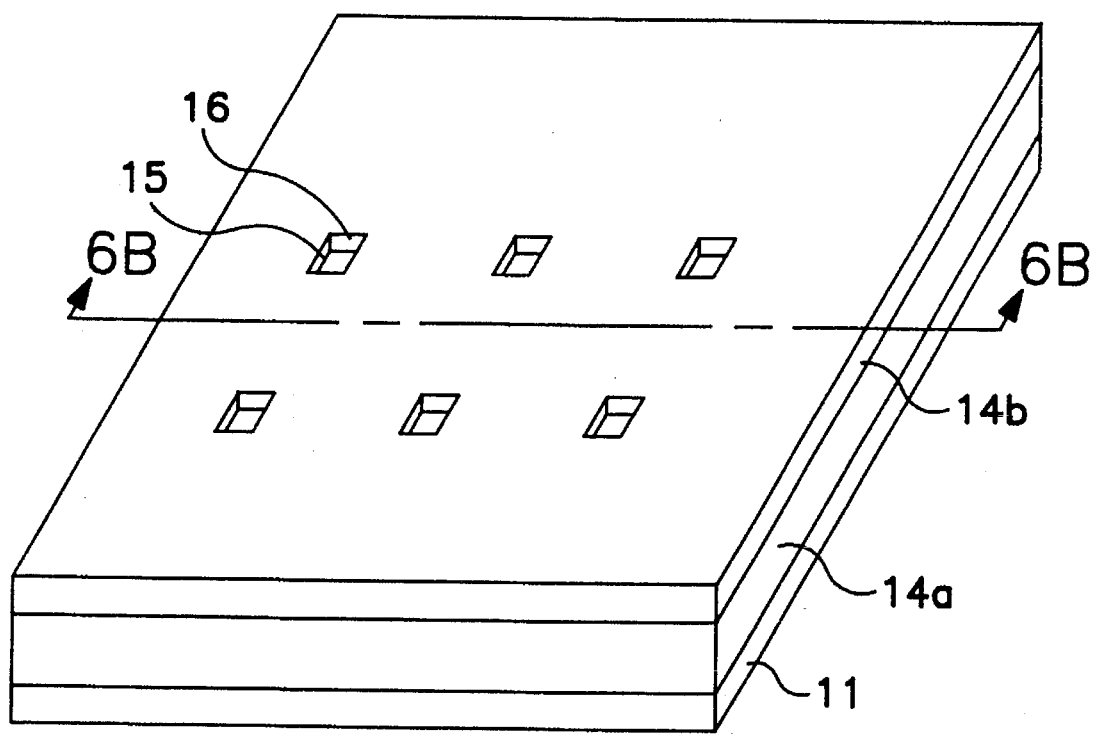
FIGS. 6(A) and 6(B) illustrate a perspective view and its 6B—6B cross-sectional view explaining a still further step of the same.
Figure 6B:
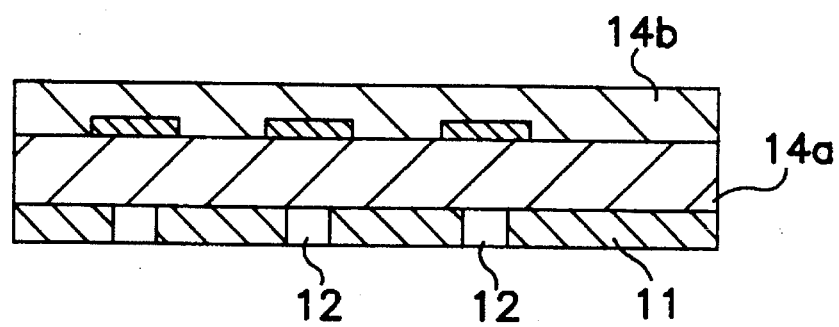
Figure 7A:
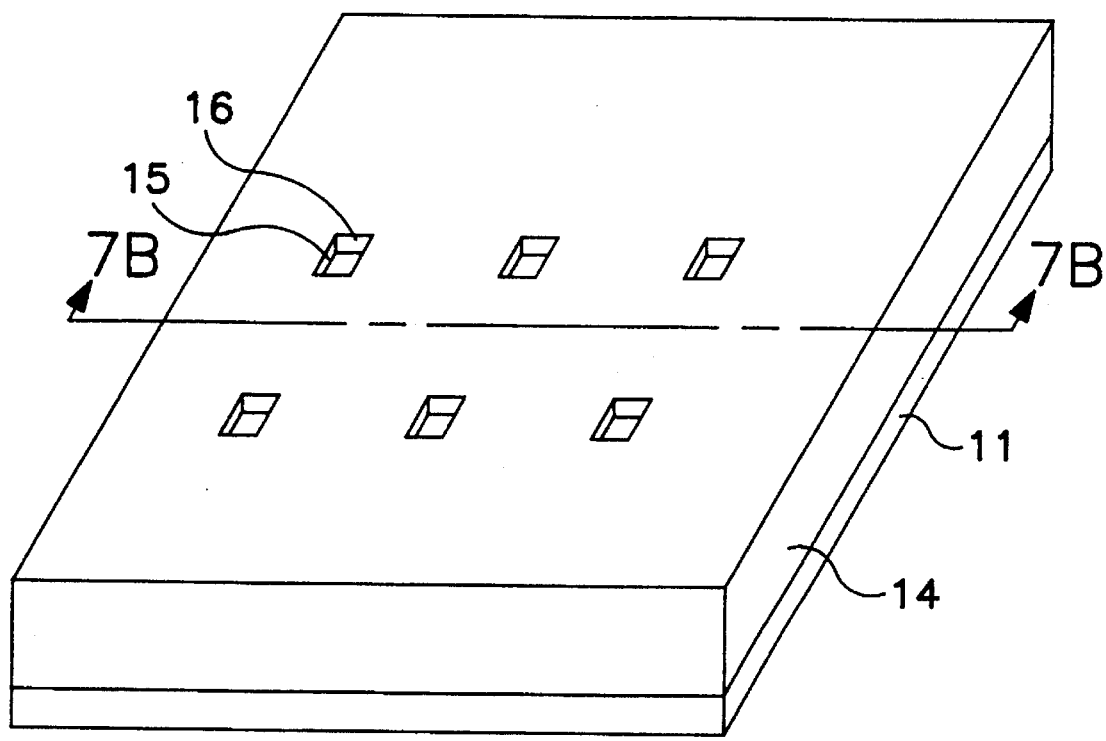
FIGS. 7(A) and 7(B) illustrate a perspective view and its 7B—7B cross-sectional view explaining a still further step of the same.
Figure 7B:
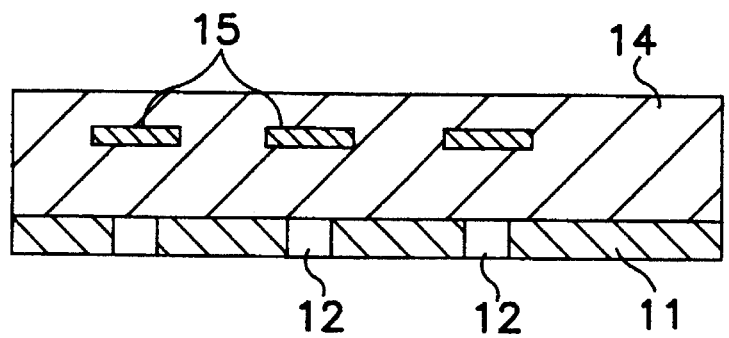

FIGS. 6(A) and 6(B) show a fourth step in which the lower green-form ceramic layer 14a is covered at top with an upper green-form ceramic layer 14b of the same ceramic material so that the internal electrode segments 15 are trapped in the green-form ceramic material. The wide portion 15b of each internal electrode segment 15 is however exposed through a bare hole 16 provided in the upper green-form ceramic layer 14b. The two ceramic layers 14a and 14b are combined to a green-form ceramic layer 14 which contains therein the internal electrode segments 15 as shown in FIG. 7.

Figure 8A:
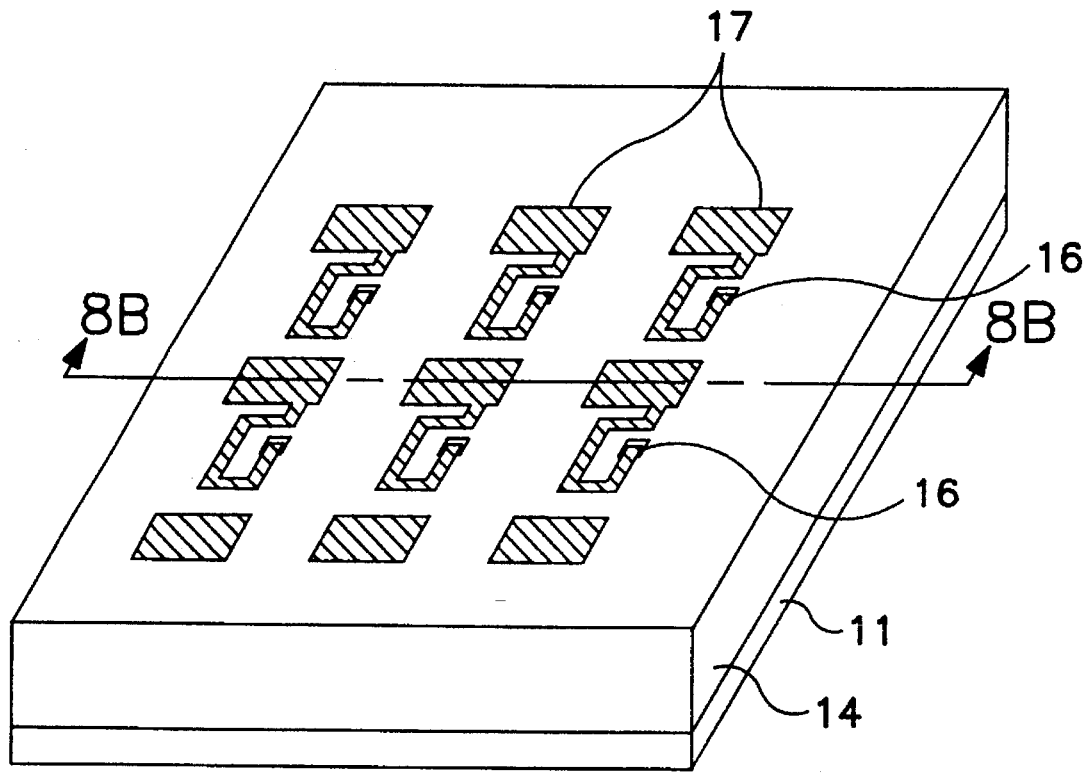
FIGS. 8(A) and 8(B) illustrate a perspective view and its 8B—8B cross-sectional view explaining a still further step of the same.
Figure 8B:
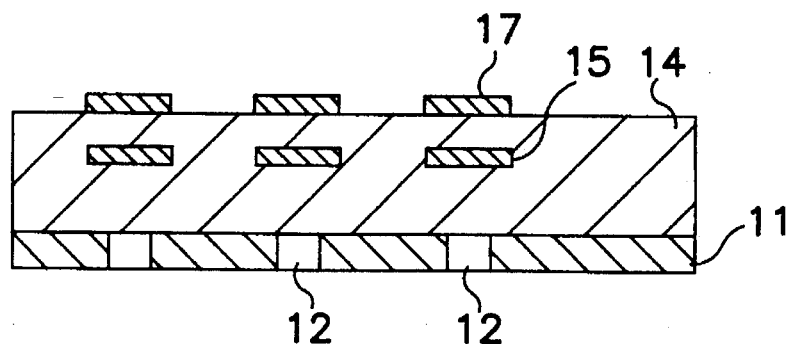

FIGS. 8(A) and 8(B) illustrate a further step where a succeeding or second pattern of internal electrode segments 17 is formed on the upper surface of the green-form ceramic layer 14. The second-pattern internal electrode segments 17 may be printed down by a screen printing method. During printing the second-pattern internal electrode segments 17, its conductive ink is distributed to fill the bare holes 16 of the upper green-form ceramic layer 14b so that the first-pattern internal electrode segments 15 are electrically connected to the second-pattern internal electrode segments 17 thus making a coil (or spiral) form of the internal electrode 9.

Figure 9A:
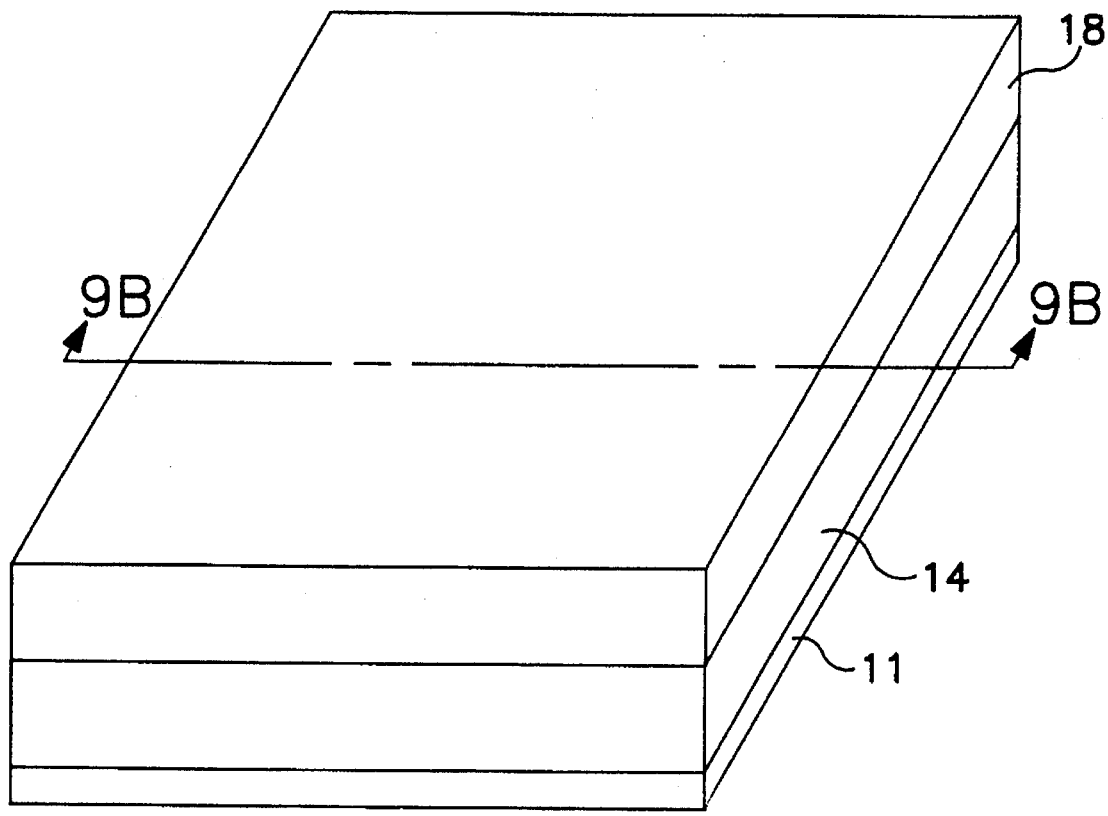
FIGS. 9(A) and 9(B) illustrate a perspective view and its 9B—9B cross-sectional view explaining a still further step of the same.
Figure 9B:
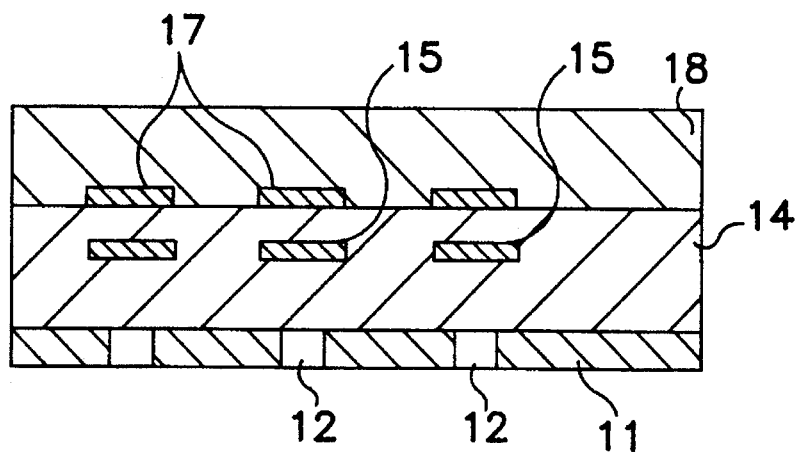

By repeating a given number of times the above steps of arranging the internal electrode segments and ceramic layers one over the other as shown in FIGS. 5 to 8, the internal electrode 9 is produced to have a desired coil form with the corresponding number of turns. FIGS. 9(A) and 9(B) show another green-form ceramic layer 18 of 0.4 mm thick developed on the green-form ceramic layer 14 by thermocompression or hot transfer bonding a plurality of green-form ceramic sheets to have a desired thickness, i.e. 0.4 mm.

The thickness of two green-form ceramic layers sandwiching the internal electrode segment was examined for yielding an optimum magnetic flux in the tip-type noise filer. It was found that when the thickness was too small in comparison to the diameter of the internal electrode coil, it created a higher magnetic resistance causing the internal electrode coil to generate a poor magnetic flux. When the thickness of the two green-form ceramic layers was too great, the magnetic resistance was increased by the coil diameter resulting in generation of an insufficient magnetic flux. The thickness of the green-form ceramic layers may be 0.1 to 10 times the thickness of the coil shape of the internal electrodes. The thickness of the green-form ceramic layers for the coil was favorable in a range from over 0.3 times the coil diameter to below 5 times.

Figure 10A:
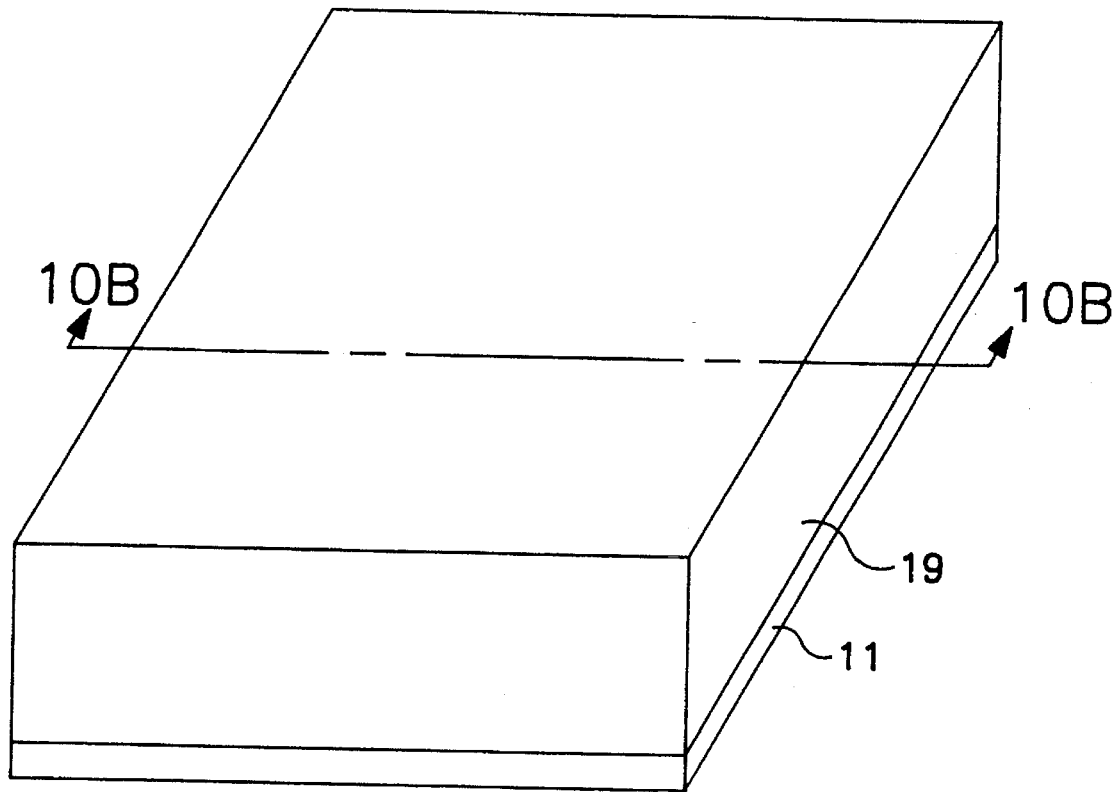
FIGS. 10(A) and 10(B) illustrate a perspective view and its 10B—10B cross-sectional view explaining a still further step of the same.
Figure 10B:
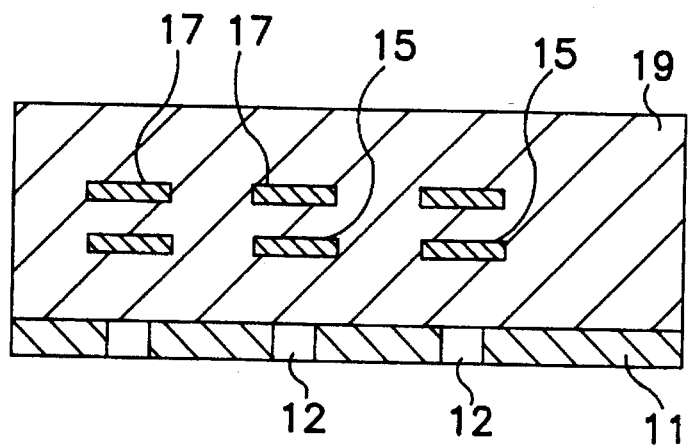

As shown in FIG. 9, the green-form ceramic layer 14 encapsulating the internal electrode segments 15 is joined to the other green-form ceramic layer 18 formed over the internal electrode segments 17, thus producing a green-form ceramic layers structure 19 with a thickness of 1.3 mm as best shown in FIGS. 10(A) and 10(B). As the result, the internal electrode segments 15 and 17 are encapsulated in the green-form ceramic layers structure 19.

Figure 11A:
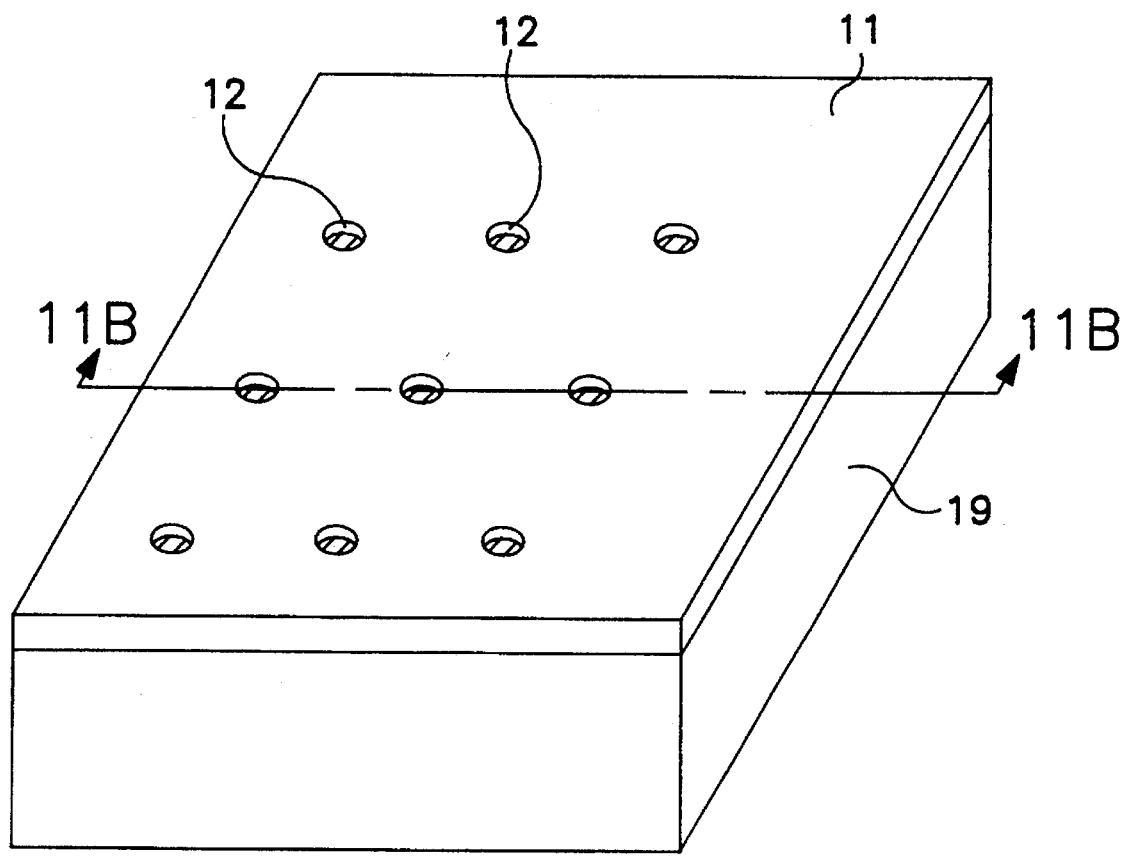
FIGS. 11(A) and 11(B) illustrate a perspective view and its 11B—11B cross-sectional view explaining a still further step of the same.
Figure 11B:
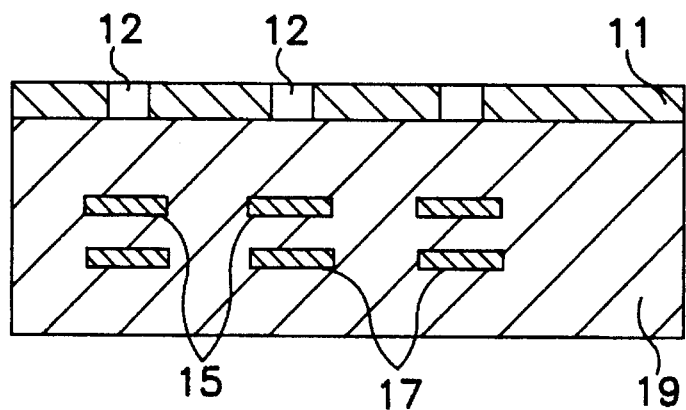

FIGS. 11 to 14 illustrate a still further step where a plurality of through holes are provided in the green-form ceramic layers structure 19 using a known sand blasting technique. The procedure starts with turning the green-form ceramic layers structure 19 of FIG. 10 upside down so that the apertures 12 of its ceramic substrate 11 face towards the nozzle of an unshown sand blaster disposed above, as shown in FIG. 11. The green-form ceramic layers structure 19 encapsulating the internal electrode segments 15 and 17 is now exposed only through the apertures 12 of the ceramic substrate 11.

Figure 12A:
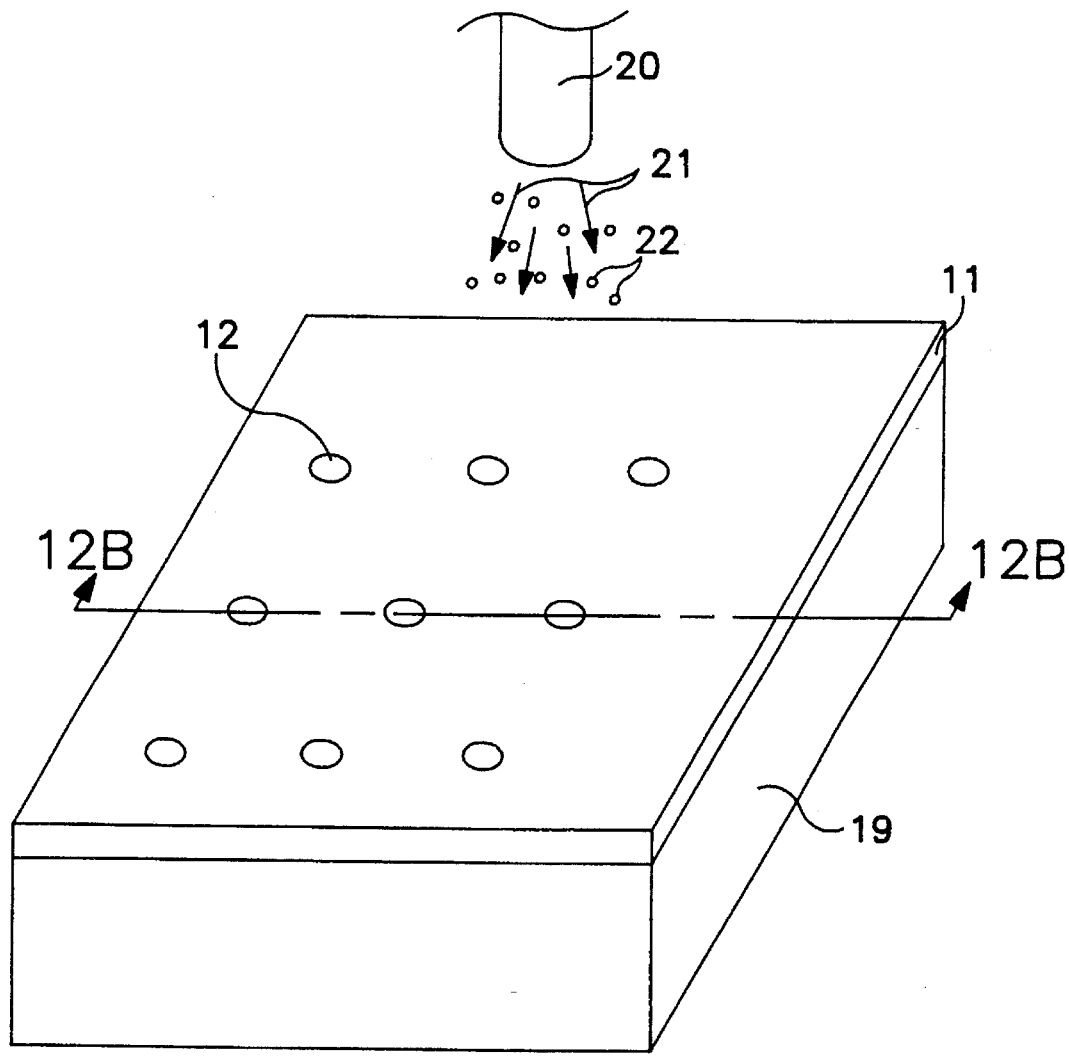
FIGS. 12(A) and 12(B) illustrate a perspective view and its 12B—12B cross-sectional view explaining a still further step of the same.
Figure 12B:
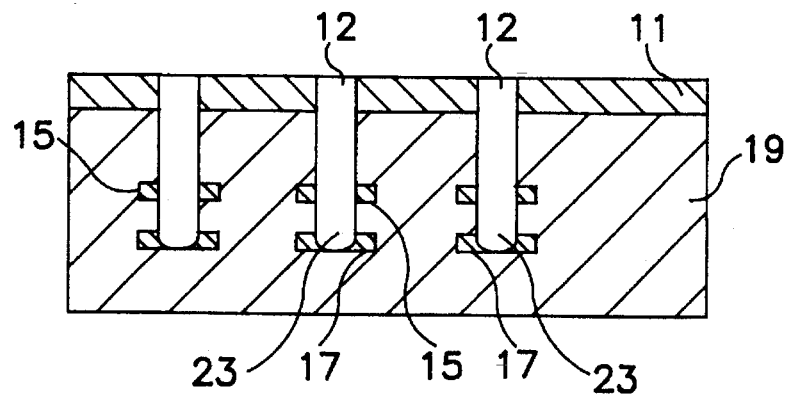
Figure 13A:
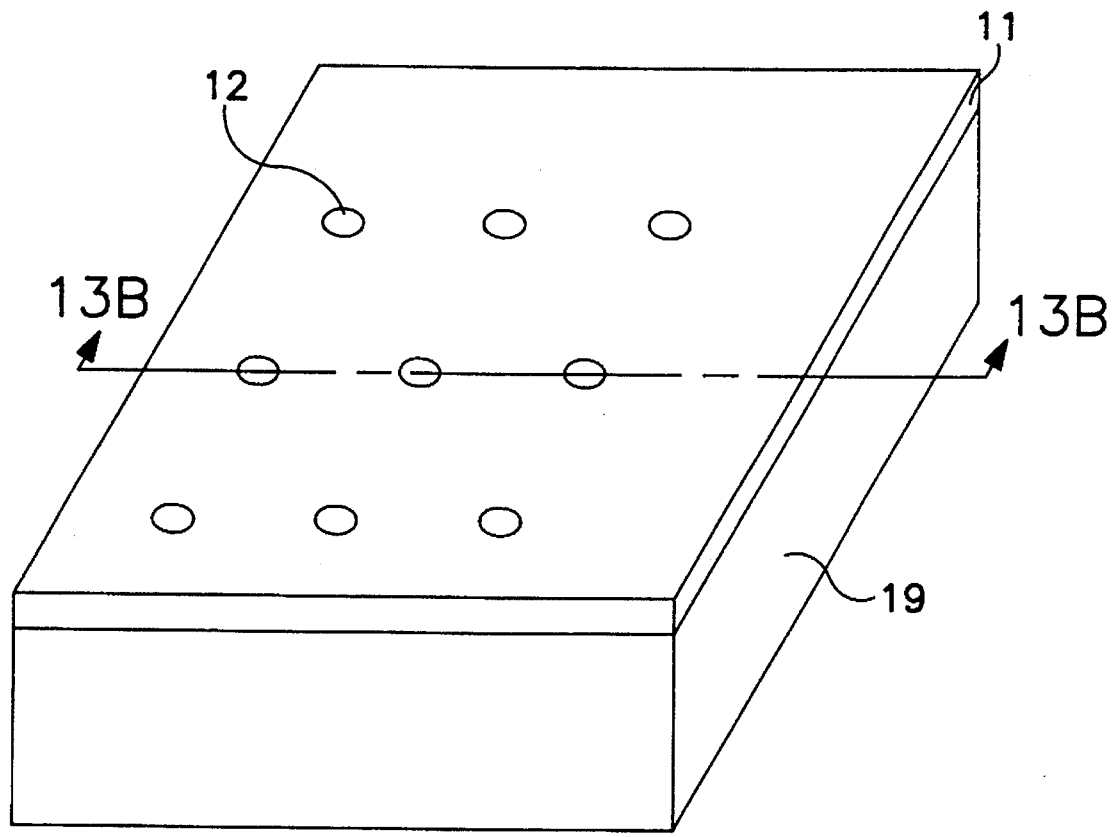
FIGS. 13(A) and 13(B) illustrate a perspective view and its 13B—13B cross-sectional view explaining a still further step of the same.
Figure 13B:
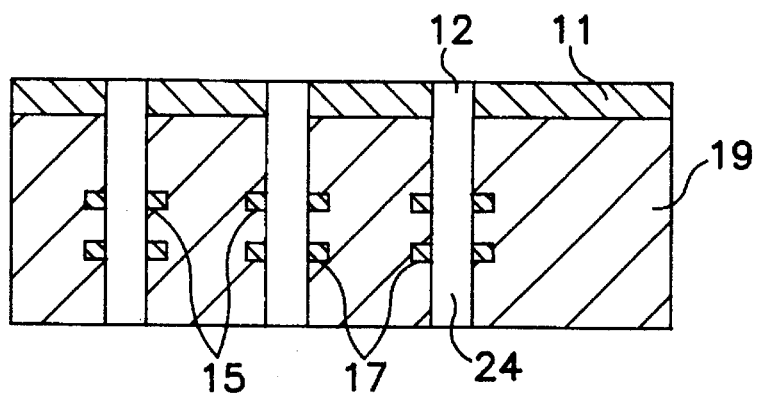

Then, the green-form ceramic layers structure 19 is subjected to sand blasting as shown in FIGS. 12 and 13. FIG. 12 is an explanatory view showing the green-form ceramic layers structure 19 during the sand blasting, FIG. 13 shows the end of the sand blasting on the green-form ceramic layers structure 19. Illustrated are the sand blasting nozzle 20 made of a ceramic material, a blast of compressed air 21 at 4 kg/cm$^2$, abrasive particles 22 made mainly of alumina, extended apertures 23, and resultant through holes 24.

As shown in FIG. 12, the abrasive particles 22 are shot out by the blast of compressed air 21 from the nozzle 20 communicated with a sand blasting main unit (not shown). The energy of the compressed air 21 causes the abrasive particles 22 (commonly, alumina grains) to strike against the surface of a work to be processed, i.e. a combination of the ceramic substrate 11 and the green-form ceramic layers structure 19, thus giving an etching abrasion effect. The etching abrasion effect is more active to the green-form ceramic layers structure 19 than to the ceramic substrate 11. As the abrasive particles 22 move into the apertures 12 of the ceramic substrate 19, they grind down portions of the green-form ceramic layers structures 19 and the internal electrode segment 15 and 17 thus creating the extensions 23 of the apertures 12, as shown in FIG. 12(B). Meanwhile, the compressed air 21 removes remaining abrasive particles and dust (unwanted scrap pieces) from the surface of the work, allowing the abrasive particles 22 (with kinetic energy) to continue to strike against a fresh surface of the work. It is a good idea that a plurality of the nozzles 20 are used and/or the work is rotated for uniform grinding.

It was also found through our experiments that the larger the size of the abrasive particles, the higher the grinding speed increased. When the diameter of the abrasive particle 22 exceeded 100 to 150 μm with the aperture 12 of the ceramic substrate 11 having a diameter of 0.4 mm, the grinding speed was decreased. It is thus needed to determine an optimum size of the abrasive particle 22 in each requirement.

It would be understood that the use of multiple blasting nozzles in the sand blasting reduces a time required for creating through holes in the work.

Figure 14A:
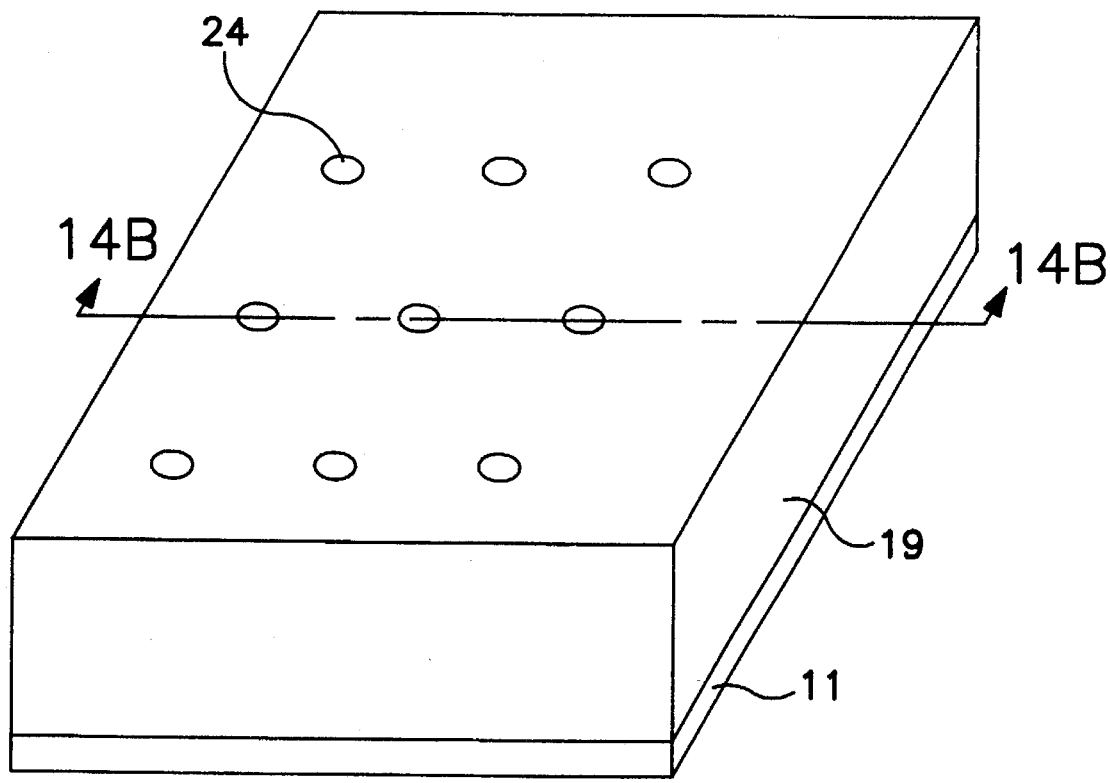
FIGS. 14(A) and 14(B) illustrate a perspective view and its 14B—14B cross-sectional view explaining a still further step of the same.
Figure 14B:
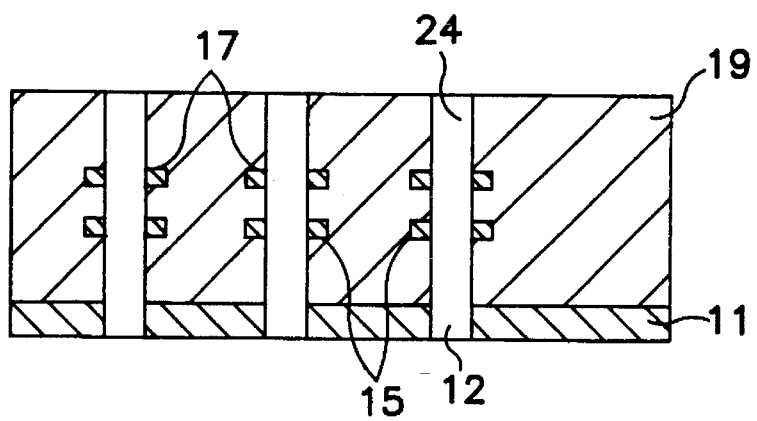

After the sand blasting, the through holes 24 are provided in the green-form ceramic layers structure 19 as shown in FIGS. 13 and 14, extending from the apertures 12 through portions of the internal electrode segments 15 and 17 encapsulated in the green-form ceramic layers structure 19. This results from the etching abrasive effect which is highly aggressive to such a material made by dispersing ceramic or metallic power into a resin as of the green-form ceramic layer structure 19 or the internal electrode segments 15 and 17 respectively.

As described, the ceramic substrate 11 is used as a masking plate in the etching and the through holes 24 of the green-form ceramic layers structures 19 can simultaneously be created at less cost and high precision without performing a troublesome positioning or making job.

Figure 15A:
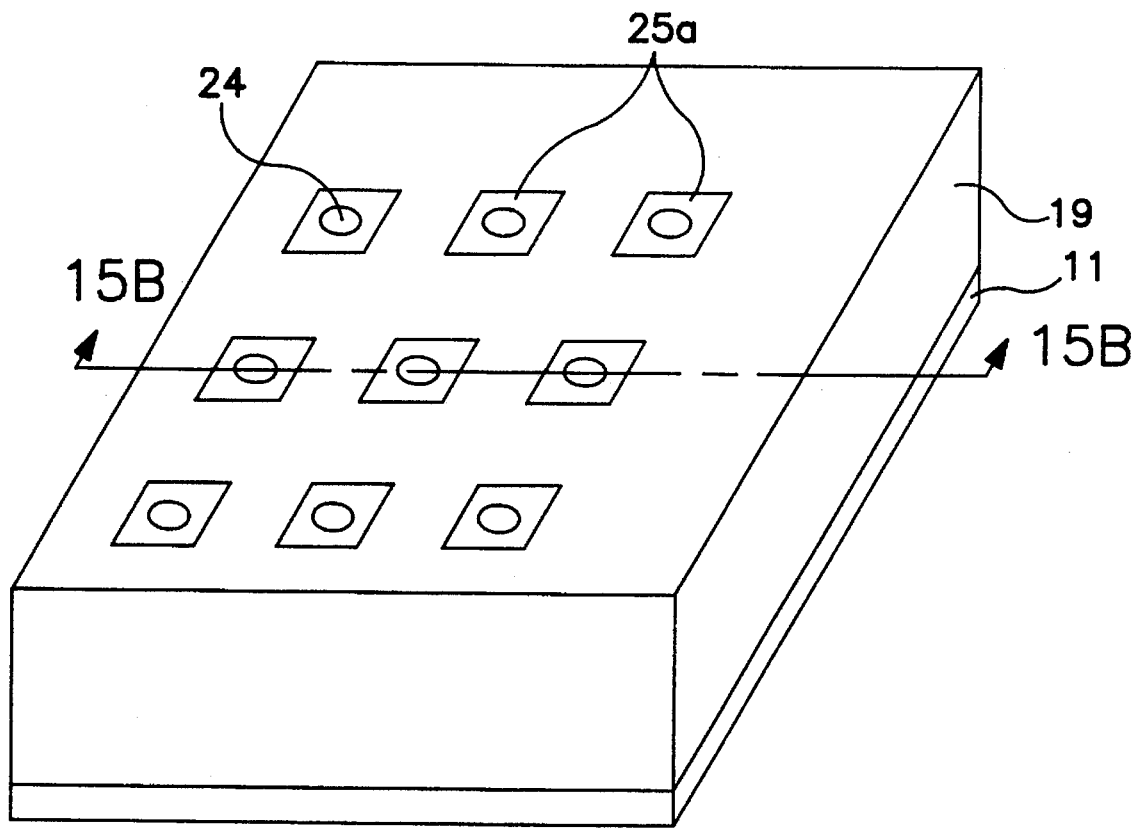
FIGS. 15(A) and 15(B) illustrate a perspective view and its 15B—15B cross-sectional view explaining a still further step of the same.
Figure 15B:
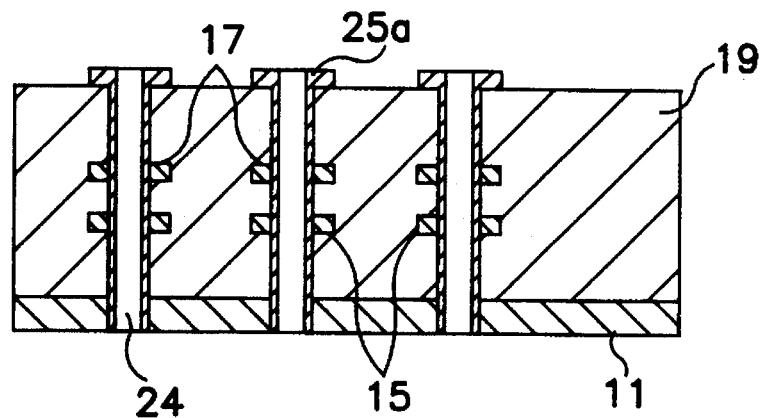

As the operation proceeds, the green-form ceramic layers structure 19 is turned back so that its through holes 24 face upward and the ceramic substrate 11 comes at the bottom as shown in FIG. 15. An amount of the conductive ink is applied by a through-hole printing technique to the through holes 24 of the green-form ceramic layers structure 19 thus forming external electrode tubes 25*a*. As the external electrode tubes 25*a* extend along the through holes 24 of the green-form ceramic layers structure 19, they are electrically connected to the internal electrode segments 15 and 17. The upper end of each external electrode tube 25*a* is exposed out from the through hole 24 and arranged in a shape appropriate for soldering of leads. It is also a good idea that a silver ink is applied to the ceramic substrate 11 from the other side to form external electrode tubs 25*b*. Accordingly, the resultant external electrodes made by the through-hole printing will be improved in shape and connectability.

Figure 17:
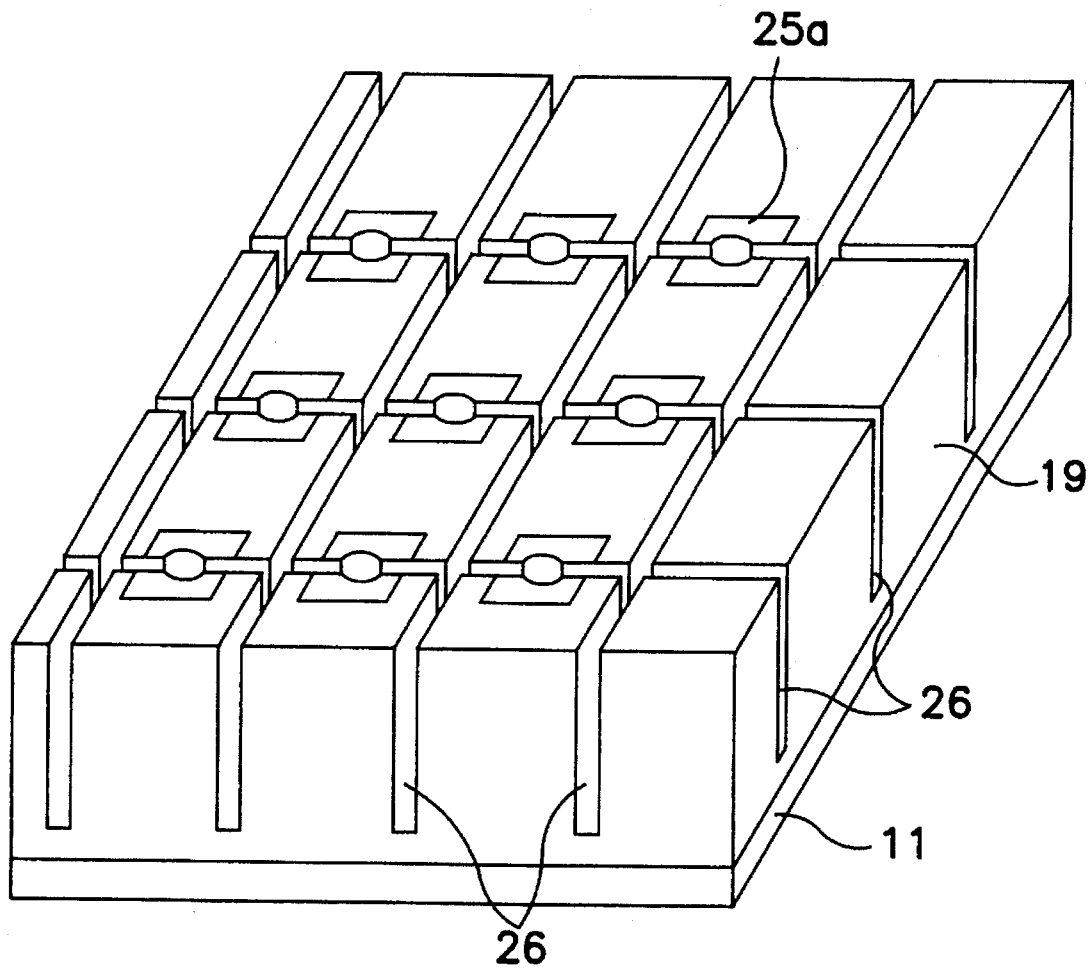
FIG. 17 is a perspective view explaining a still further step of the same.

The through-hole printing may be carried out by a screen printing machine with a paint suction table. The conductive silver ink used for through-hole printing of the electrodes has such a viscosity that the it is distributed unformly on the inner wall of each through aperture FIG. 17 shows a further step where the green-form ceramic layers structure 19 is subjected to dicing. As shown, the green-form ceramic layers structure 19 is cut into a predetermined number of dice to make dicing slits 26 corresponding to the score lines 13 arranged on the ceramic substrate 11. The dicing may be carried out by a known silicon wafer dicing apparatus. Although the depth of the dicing slits 26 is arbitrarily determined, it is preferred not to reach the ceramic substrate 11 as shown in FIG. 17. The dicing up to the ceramic substrate 11 requires consumption of a considerable time and causes the cutting blade of the dicing apparatus to last not long.

Figure 18:
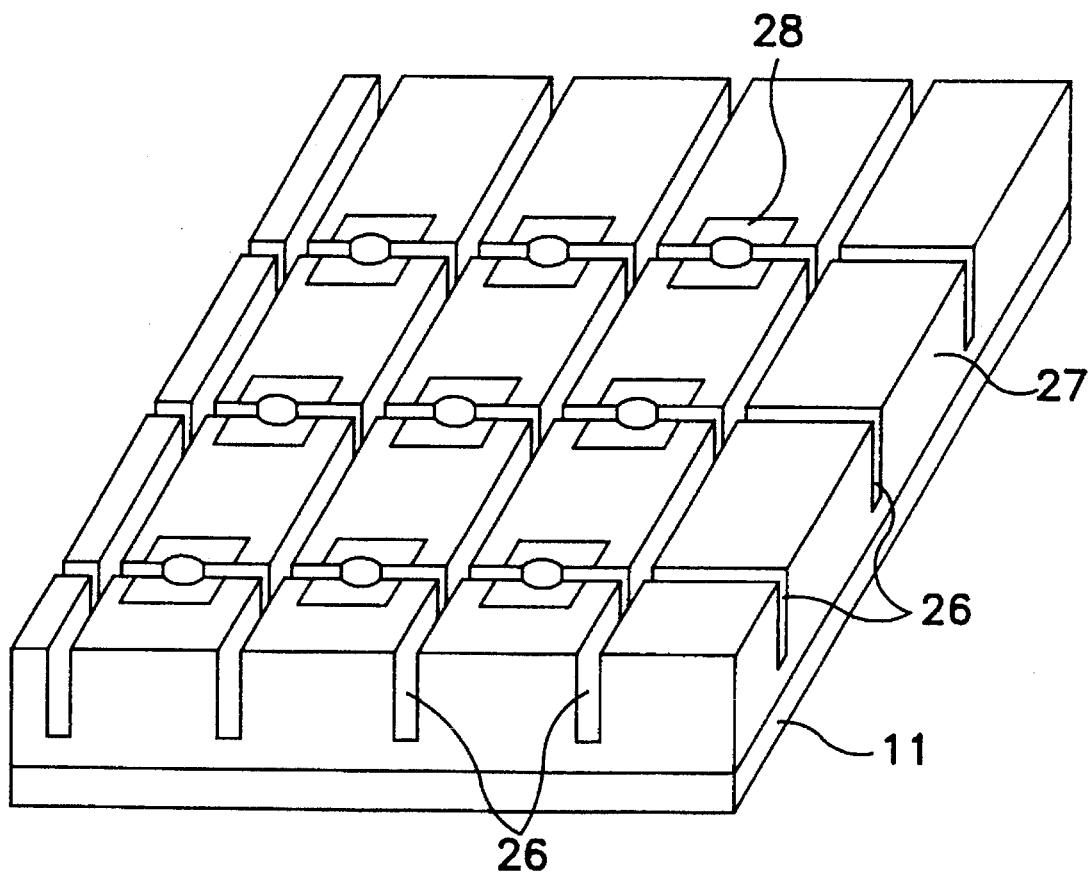
FIG. 18 is a perspective view explaining a still further step of the same.

After the dicing, the green-form ceramic layers structure 19 is baked at 950° C. to produce a ceramic densification 27 shown in FIG. 18. Also shown in FIG. 18 is an external electrode tube 28 shifted from 25*a* of FIG. 17 after the baking. Finally, the ceramic densification 27 with the ceramic substrate 11 is separated into noise filter tips illustrated in FIGS. 1 and 2 by cutting along the score lines 13 (FIG. 3) on the ceramic substrate 11. As understood, the score lines 13 and the dicing slits 26 extend across the apertures 12 of the ceramic substrate 11 and the through holes 24 of the ceramic densification 27 so that two external electrodes of each tip-type noise filter appear at opposite ends of the same.

As described, the first embodiment of the present invention allows each layer of the green-form ceramic layers structure 19 to extend in flatness for ease of printing a corresponding pattern of the internal electrode segments while the apertures 12 of the ceramic substrate 11 has completely been closed with the lowest layer of the same. Accordingly, a silver ink of the internal electrode segments 15 and 17 can be printed as small as 30 to 40 μm in width.

The green-form ceramic layers structure 19 may be fabricated by printing a given number of ceramic ink layers one over the other directly on the ceramic substrate 11. Three different results of this ceramic ink printing procedure are illustrated in FIG. 19. FIG. 19(A) shows a resultant green-form ceramic ink layers structure 29 with its bottom portions entering the apertures 12 of the ceramic substrate 11; FIG. 19(B) with its bottom portions not entering the same; and FIG. 19(C) with its bottom portions protruding downwardly from the same. In any of the cases shown in FIGS. 19(A), 19(B), and 19(C), the through holes can definitely be provided in the green-form ceramic ink layers structure 29 by sand blasting from the ceramic substrate 11 side.

In Example 1 according to the present invention, the grinding of the through holes 24 of the green-form ceramic layers structure 19 by sand blasting can be executed regardless of the size of the green-form ceramic layers structure 19, for example, when it is smaller than the ceramic substrate 11 as shown in FIG. 20.

The internal electrode 9 of the tip-type noise filter may be arranged to come in direct contact with the ceramic base 7.

Although the through-hole printing is employed to print the internal electrode segments 15 and 17 in Example 1, it is illustrative and not limitative. The through-hole printing may also be carried out on the ceramic densification 27 as well as the green-form ceramic layers structure 19 before baking. For example, after the step illustrated in FIG. 14, the procedure is skipped over the through-hole printing step explained with FIGS. 15 and 16 (and if desired, also the step of FIG. 17) to the baking step shown in FIG. 18 and at a final step, the through-hole printing is performed. This procedure permits the baking of an electrode printing ink to be carried out at as a lower temperature as 800° C. In other words, the electrode printing ink may be a low cost conductive material such as 100% silver.

It is not obligatory to develop the green-form ceramic layers one over the other directly on the ceramic substrate 11. The green-form ceramic layer structure 19 may be fabricated separately and bonded to the ceramic substrate 11 with equal success.

EXAMPLE 2

Example 2 according to the present invention will be described in the form of steps of producing an array-type ceramic electronic device referring to the relevant drawings.

Figure 22:
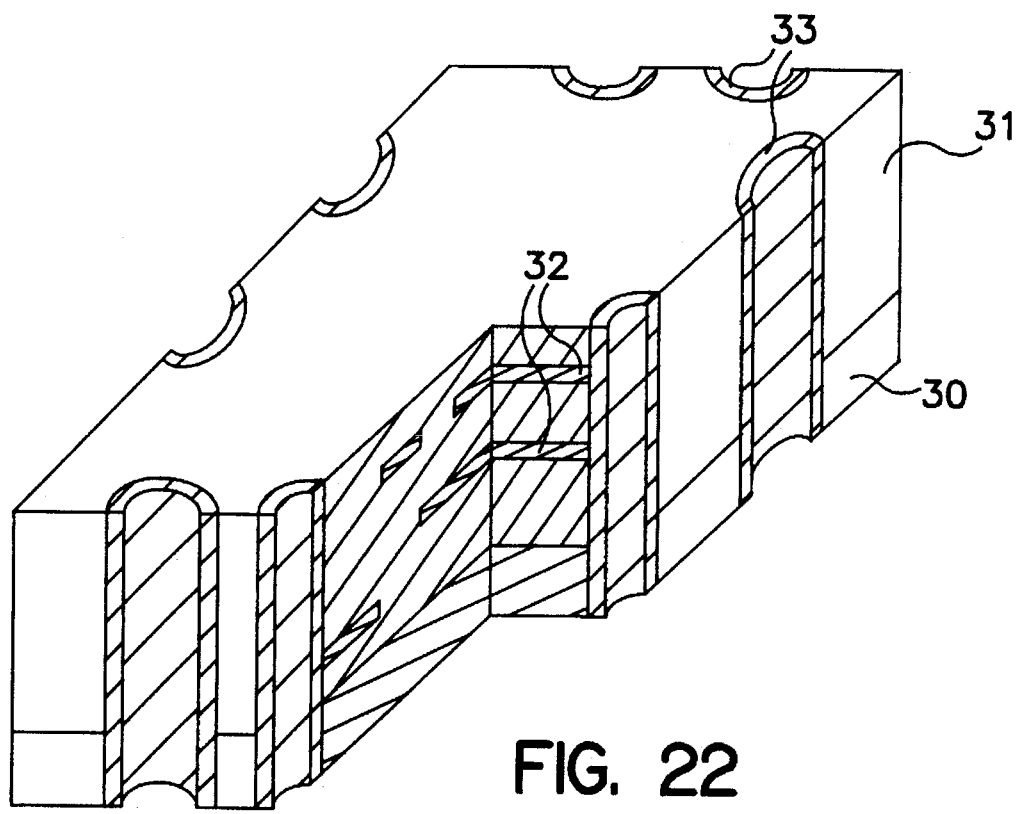
FIG. 22 is a partially broken perspective view of an array-type ceramic electronic device of Example 2 according to the present invention.

FIG. 22 illustrates a typical of the array-type ceramic electronic device having external electrodes formed by the through-hole printing explained in Example 1. Shown are a ceramic base 30, a ceramic layers block 31 made by baking its green form, internal electrodes 32 encapsulated in the ceramic layers block 31, and external electrodes 33 connected to their corresponding internal electrodes 32.

Each external electrode 33 of Example 2 is electrically connected at vertically aligned different locations to the internal electrode 32 in the ceramic layers block 31.

Figure 23:
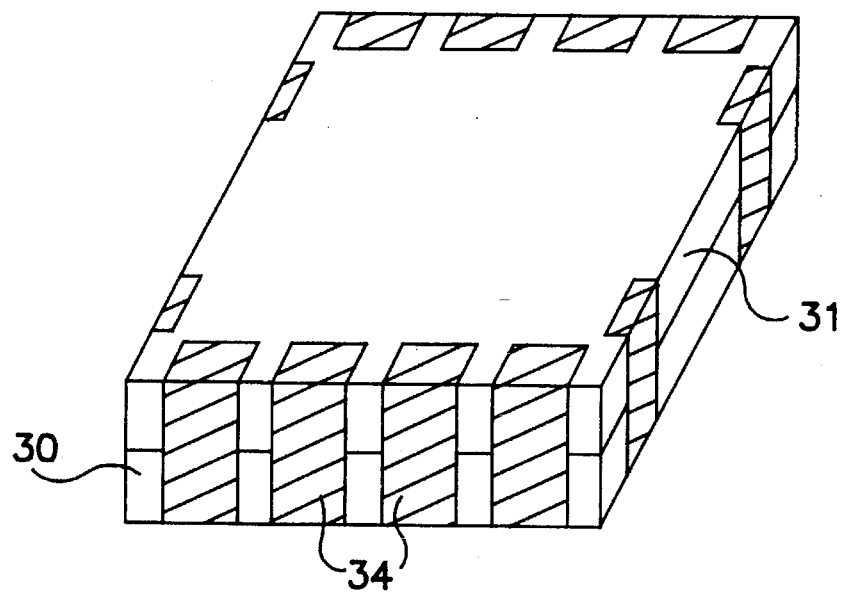
FIG. 23 is a perspective view of another form of the array-type ceramic electronic device of Example 2.

FIG. 23 shows another form of the array-type ceramic electronic device different from that of FIG. 22, in which the external electrodes of a specific shape are denoted by 34. The external electrodes 34 are fabricated by printing a pattern of conductive ink on the ceramic layer block 31 or base 30 at broad stroke and in abundant quantity enough to fill the through holes so that the sides of the ceramic layer block 31 and the ceramic base 30 remain flat. More particularly, after the through holes are filled with the conductive ink, the ceramic layers block 31 on the ceramic base 30 is separated from its mother plate.

According to the second embodiment, the ceramic material of the ceramic layers block 31 is extended to and around the through holes so that its functional area increases. Hence, it will give more freedom in design and production of the ceramic electronic device and also, contribute to the size reduction and the performance enhancement of the same to meet the demand of increasing the number of the external electrodes.

Figure 24:
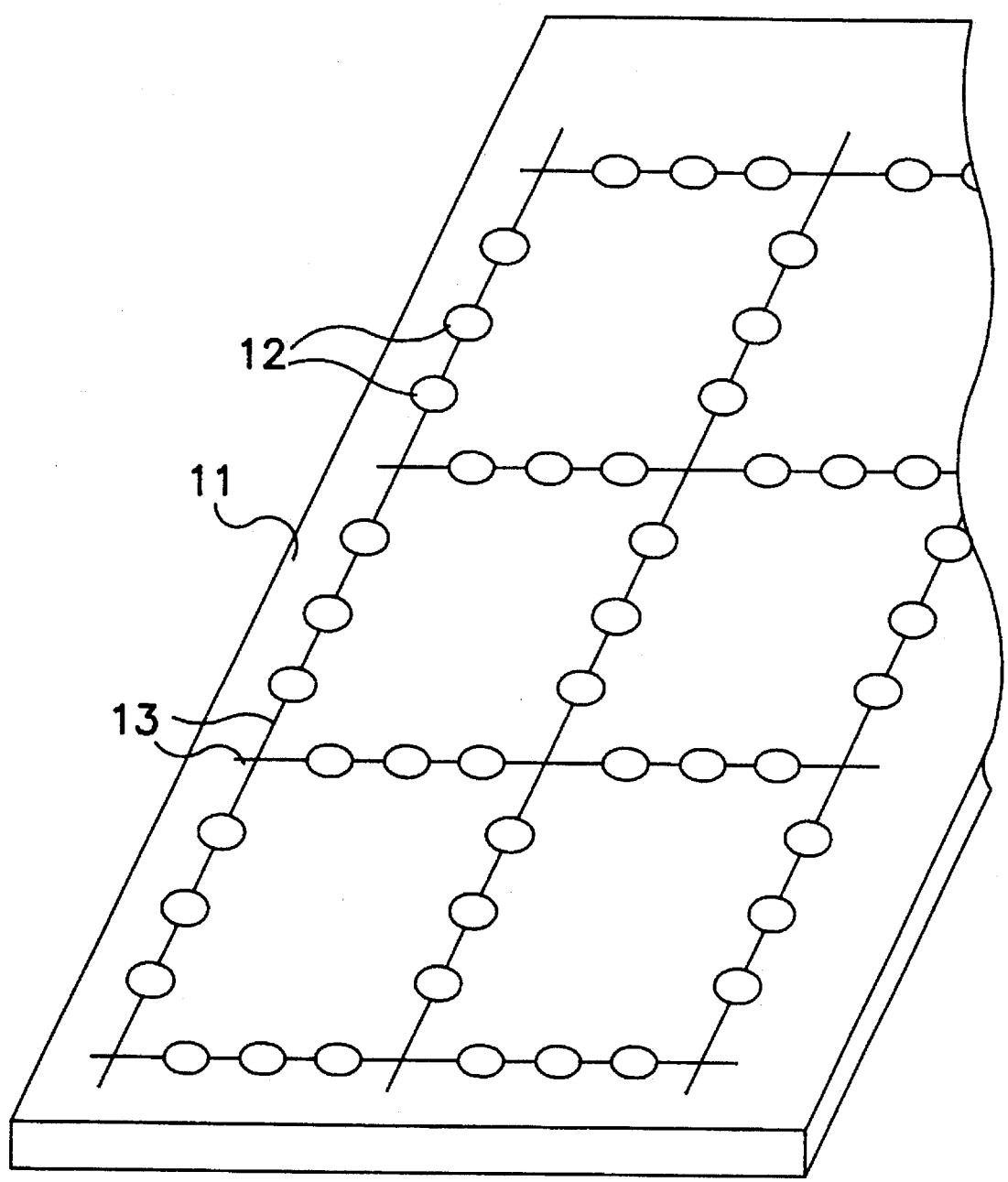
FIG. 24 is a perspective view of a ceramic substrate of Example 2.

FIG. 24 shows a ceramic substrate 11 for the array-type ceramic electronic devices of Example 2. As understood, the ceramic substrate 11 has a plurality of apertures 12 therein for the external electrodes and score lines 13 extending across the apertures 12 so that it can easily be cut apart along the score lines 13. As the result, a predetermined number of external electrodes appear at the four edges of each array-type ceramic device. More specifically, a green form of the ceramic layers block encapsulating the internal electrodes is formed on the ceramic substrate 11 and then, the apertures 12 of the ceramic substrate 11 are extended by sand blasting, while the ceramic substrate 11 acting as a masking, thus forming a corresponding number of through holes. A conductive ink is applied to the through holes producing the external electrodes before separating the green form on the ceramic substrate 11 into shapes. After the separation, an array-type ceramic electronic device having the outer electrodes at its four edges such as shown in FIG. 22 is obtained.

The procedure of producing the array-type ceramic electronic device will be explained in more details. The ceramic substrate 11 (80×55 mm in size and 0.635 mm in thickness) was provided having the score lines 13 thereon for producing a given number of array-type ceramic device of 3.2×6.4 mm in size. The apertures 12 of the ceramic substrate 11 were 0.3 mm in diameter and arranged at intervals of a 1.27-mm pitch across and along the score lines 13, as shown in FIG. 24. When the apertures 12 (for the external electrodes) are arranged as shown in FIG. 24, the external electrodes 34 of the resultant array-type ceramic device of FIG. 23 are twelve in total, four at each long side and two at each short side.

The ceramic substrate 11 having the apertures 12 was covered at upper surface with a 7×5-cm full coating of ferrite ink using a screen printing method. As a portion of the ferrite ink moved into the apertures 12 of the ceramic substrate 11, the ink coating was slightly distorted. However, the apertures 12 were completely filled after repeating a print and dry process and the distortion on the coating was eliminated. The ferrite ink coating was finished with a thickness of about 100 μm so that it covered the entire porous surface of the ceramic substrate 11 (which will then be referred to as a coated substrate hereinafter). The coated substrate 11 is equal to a combination of a green-form ceramic sheet and a ceramic base. More particularly, the coated substrate 11 is favorable in handling and accurate in dimensions due to the ceramic base and also, improved in compatibility with a printing ink due to the surface flatness of the green-form sheet. Then, the coated substrate 11 was covered with multiple layers (over 20 layers with some insulations) which includes 8 layers (of silver palladium) for internal electrodes and constitutes a green-form ceramic layers structure.

The sand blasting was applied to the green-form ceramic layers structure from the ceramic substrate (or no green-form layers) side with a sand blasting apparatus, in a similar manner as of Example 1, to produce through holes. The through holes of the green-form ceramic layers structure was then subjected to a through-hole printing for developing the external electrodes tubes explained in FIGS. 15 and 16. The green-form ceramic layers structure on the coated substrate was slitted, baked, and separated along the score lines 13 into blocks which were the array-type ceramic electronic devices shown in FIG. 22.

It may happen that an external electrode is disconnected as the green-form ceramic layers structure contracts during the baking. This trouble can be eliminated by producing the through holes of uniform cross section for ensuring the uniform thickness of through-hole printing ink and/or by increasing the physical tightness and reducing a difference in thermal expansion between the ceramic layers structure and the ceramic substrate. Also, the through-hole printing ink may be swelled to as high as 10 μm or the electrode printing pattern of the conductive ink may be calculated to a size to offset dimensional changes of the green-form ceramic layers structure after the baking. It is possible to have the through holes of the green-form ceramic layers structure arranged smaller in diameter than the apertures of the ceramic substrate for compensating a result of contraction.

EXAMPLE 3

Figure 25:
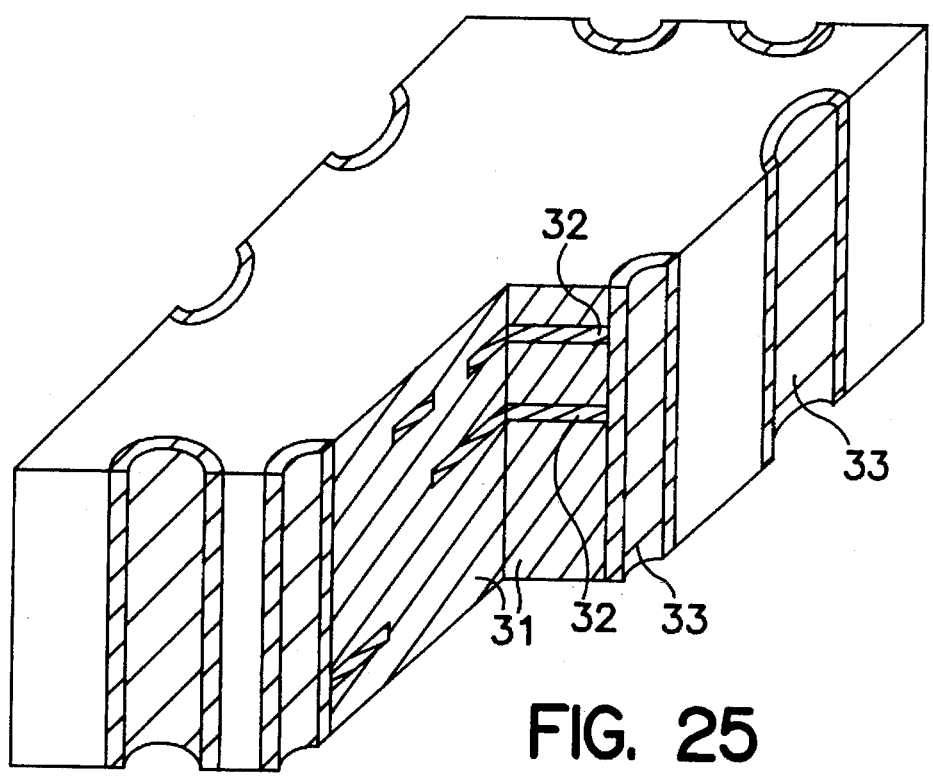
FIG. 25 is a partially broken perspective view of an array-type ceramic electronic device of Example 3 according to the present invention.

FIG. 25 is a perspective view of an array-type ceramic electronic device showing Example 3 according to the present invention. Example 3 is differed from Example 2 by the fact that the ceramic base 30 is absent. When the thickness of the array-type ceramic electronic device is critical, for example, due to the application of a more number of printing layers or coil turns of the internal electrode, the ceramic base can be eliminated as shown in FIG. 25.

Figure 16A:
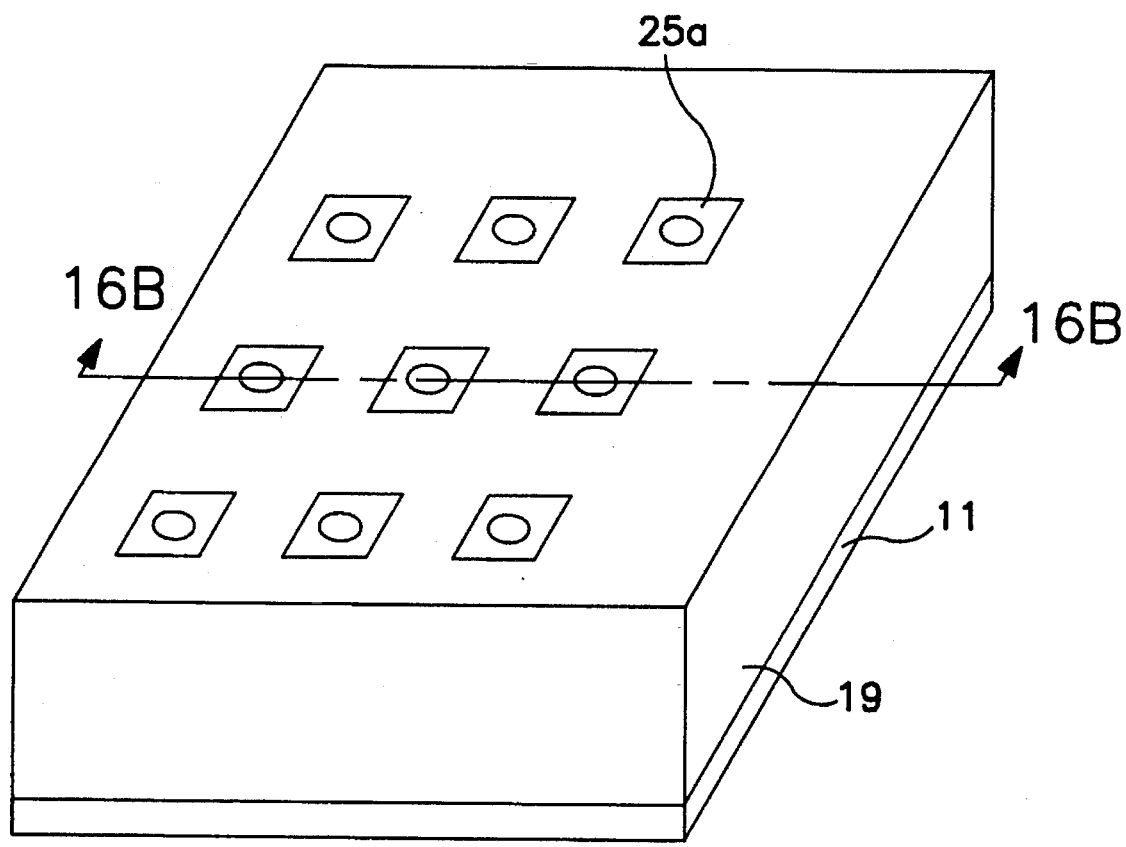
FIGS. 16(A) and 16(B) illustrate a perspective view and its 16B—16B cross-sectional view explaining a still further step of the same.
Figure 16B:
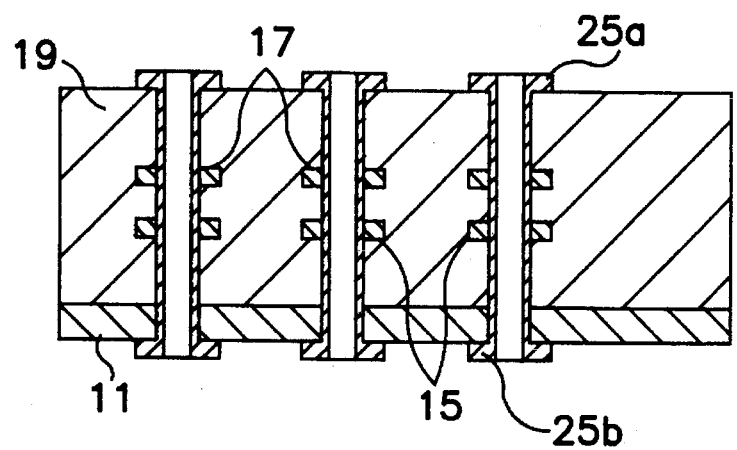

This will be explained in more details. A green-form ceramic layers structure 19 such as shown in FIG. 16 is formed by the process described in Example 1 and then, removed from a ceramic substrate 11. The removal from the ceramic substrate 11 may be facilitated by applying in preparation a water soludable resin material on to the ceramic substrate or minimizing the surface roughness of the ceramic substrate 11 to reduce the adhesive strength with anchor effect. Also, the ceramic substrate 11 may be replaced with a surface-processed metal plate which is easily removed when needed. The green-form ceramic layers structure 19 is then cut by a dicing machine.

After baking and separating the green-form ceramic layers structure 19 without its ceramic substrate 11, the array-type ceramic electronic device shown in FIG. 25 is obtained less a ceramic base. Even if the array-type electronic device is a ceramic capacitor, its array form will be produced with ease. Other components of the array-type ceramic electronic device of FIG. 25 are identical to those shown in FIG. 22.

It should be understood that the absence of the ceramic base is applicable to not only an array-type ceramic device but also a tip-type ceramic device such as described in Example 1. Some tip-type ceramic devices are required to minimize its size and weight substantially and their non ceramic base type will much be appreciated. As the tip device is reduced in size, its resistance to breakage will increase. Accordingly, any reduction in the physical strength due to the absence of the ceramic base will be negligible.

EXAMPLE 4

Figure 26:
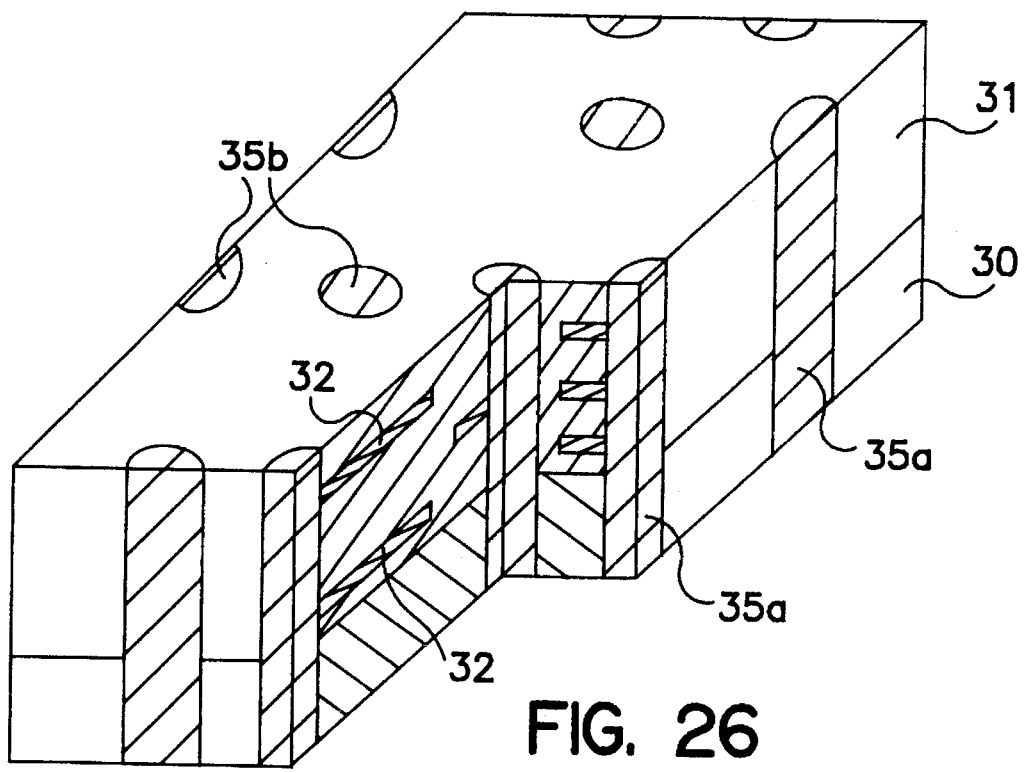
FIG. 26 is a partially broken perspective view of an array-type ceramic electronic device of Example 4 according to the present invention.

FIG. 26 is a perspective view of an array-type ceramic electronic device of Example 4 according to the present invention. Example 4 is differed from Example 2 by the fact that the external electrodes are arranged at the inner area as well as at the four edges of the array-type ceramic device. As shown, the external electrodes at the four edges are denoted by 35a and the external electrodes at the inner area are denoted by 35b being also regarded as through electrodes. The through electrodes 35b vertically extend across a ceramic base 30 and a ceramic layers block 31 and is electrically connected to their corresponding internal electrodes 32. The difference between the external electrodes 35a and the through electrodes 35b resides in only their locations at the edge and inner area respectively. The through electrodes 35b act as extra electrodes of the array-type ceramic device.

Figure 27:
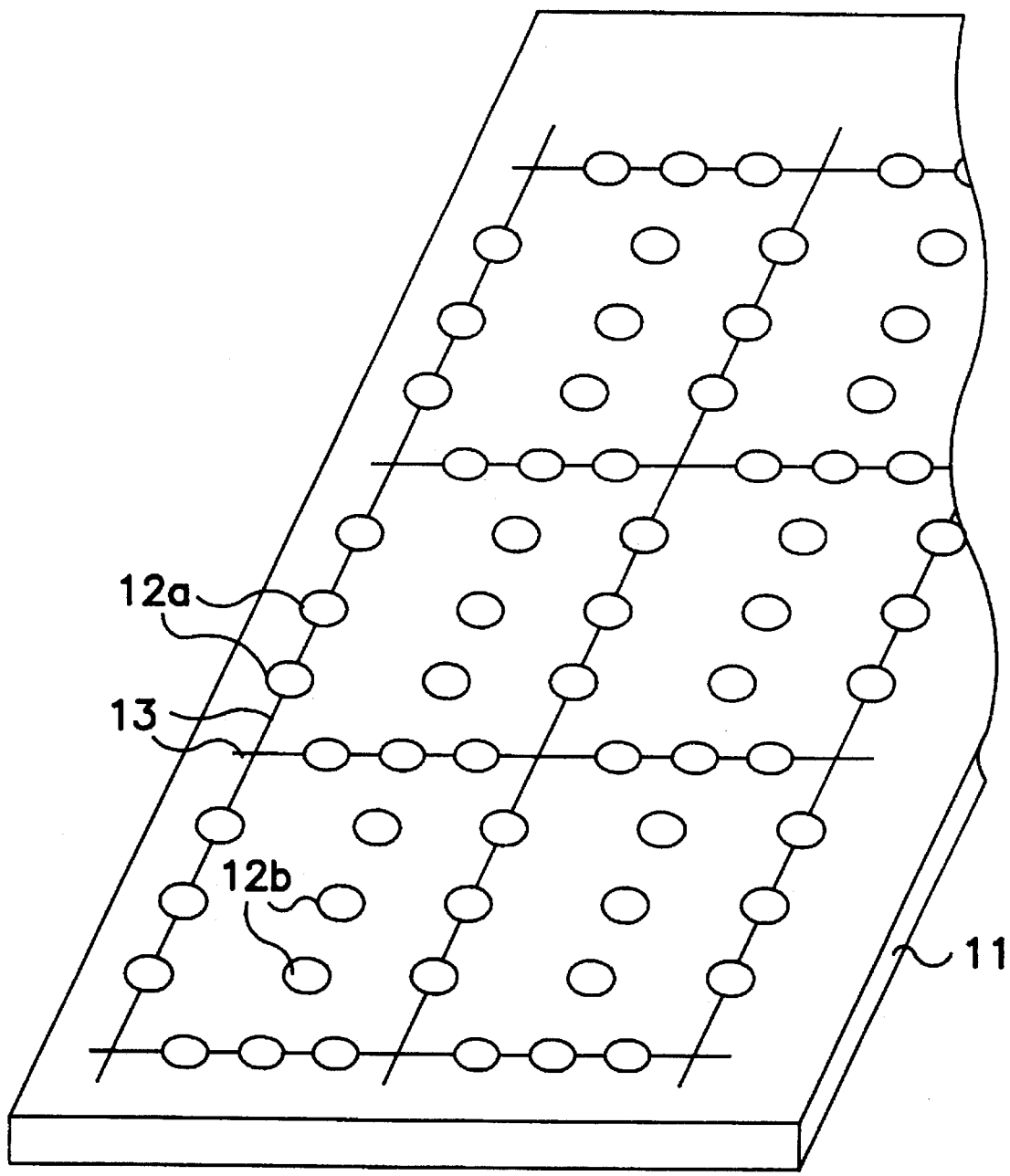
FIG. 27 is a perspective view of a ceramic substrate of Example 4.
Figure 28:
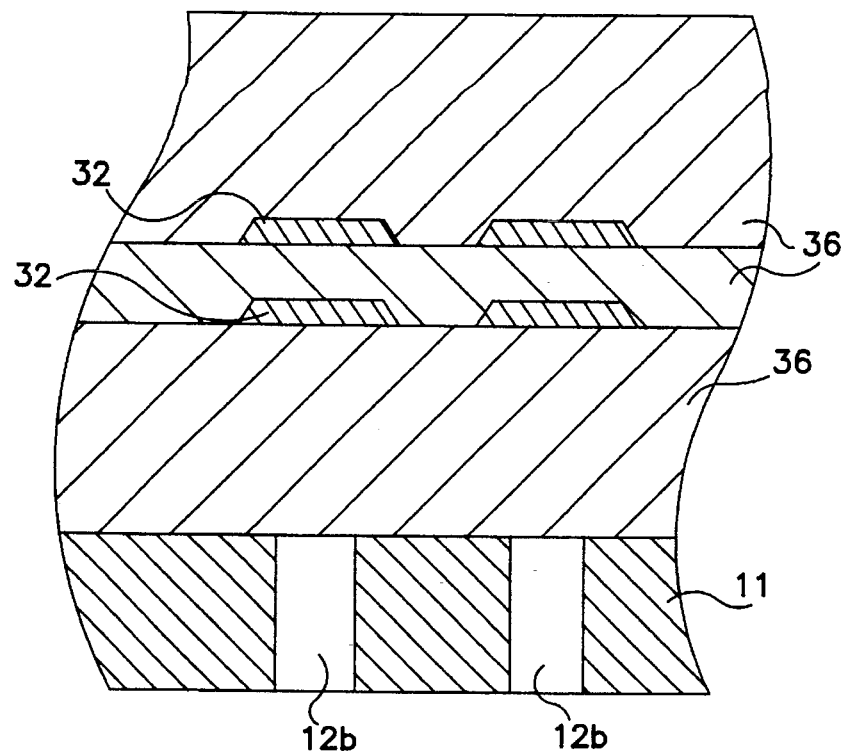
FIG. 28 is cross-sectional view explaining a step of forming electrodes of Example 4.
Figure 29:
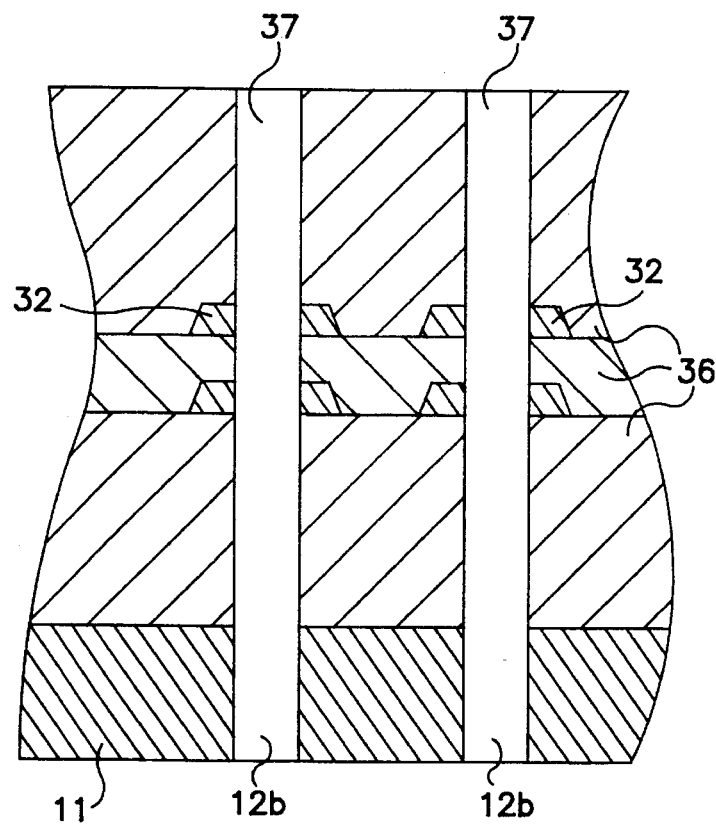
FIG. 29 is cross-sectional view explaining another step of forming the electrodes of the same.
Figure 30:
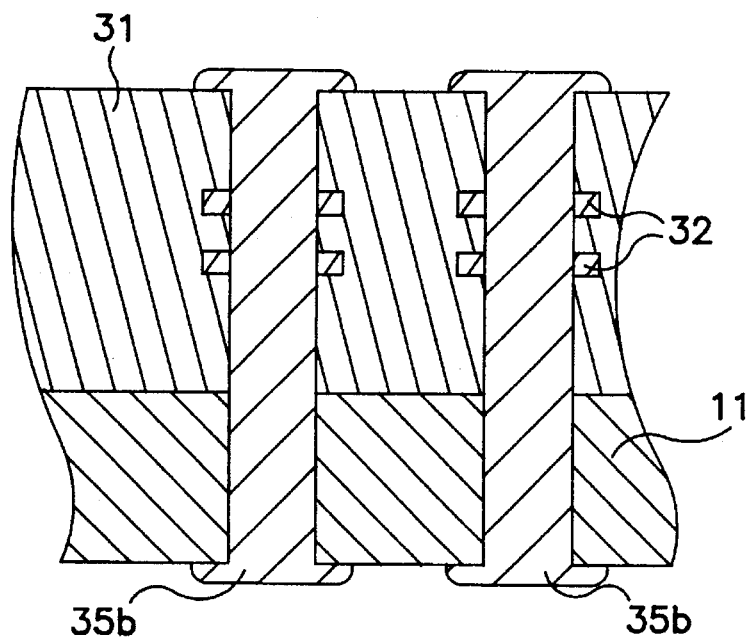
FIG. 30 is cross-sectional view explaining a further step of forming the electrodes of the same.
Figure 31:
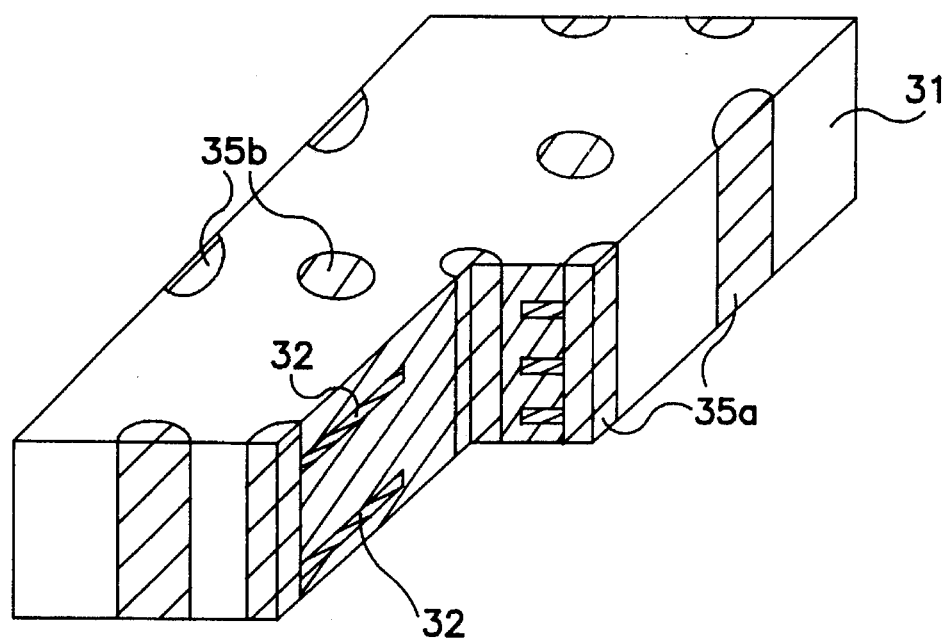
FIG. 31 is a partially broken perspective view of another form of the ceramic electronic device of Example 4.

The method of producing the through electrodes 35b will now be explained referring to FIGS. 27 to 30. As shown in FIG. 27, a ceramic substrate 11 is perforated to have apertures 12a and 12b which are designated to the edges and inner area of each array-type ceramic device respectively. A plurality of green-form ceramic layers 36 are formed one over the other on the ceramic substrate 11 thus to develop and encapsulate the internal electrodes 32, as shown in FIG. 28. After the apertures 12a and 12b of the ceramic substrate 11 are extended to form through holes 37 across the green-form ceramic layers 36 and the internal electrodes 32, portions of the internal electrodes 32 come exposed to the through holes 37, as shown in FIG. 29. The through holes 37 are filled with an electrode material which is then baked. As the result, the through electrodes 35b are produced as shown in FIG. 30.

Also, if the array-type ceramic device is arranged without its ceramic base, it can be minimized in size and still contribute to the high performance of any composite device because of its through electrodes 35b installed in addition to the external electrodes 35a. For ease of eliminating the ceramic base, the ceramic substrate may preliminarily be coated at its upper surface with a resin layer specified in decomposition temperature or solubility or another ceramic layer calcinable at a different temperature so that it can easily be removed from the ceramic layers structure which has been converted from its green form by baking.

EXAMPLE 5

Figure 32:
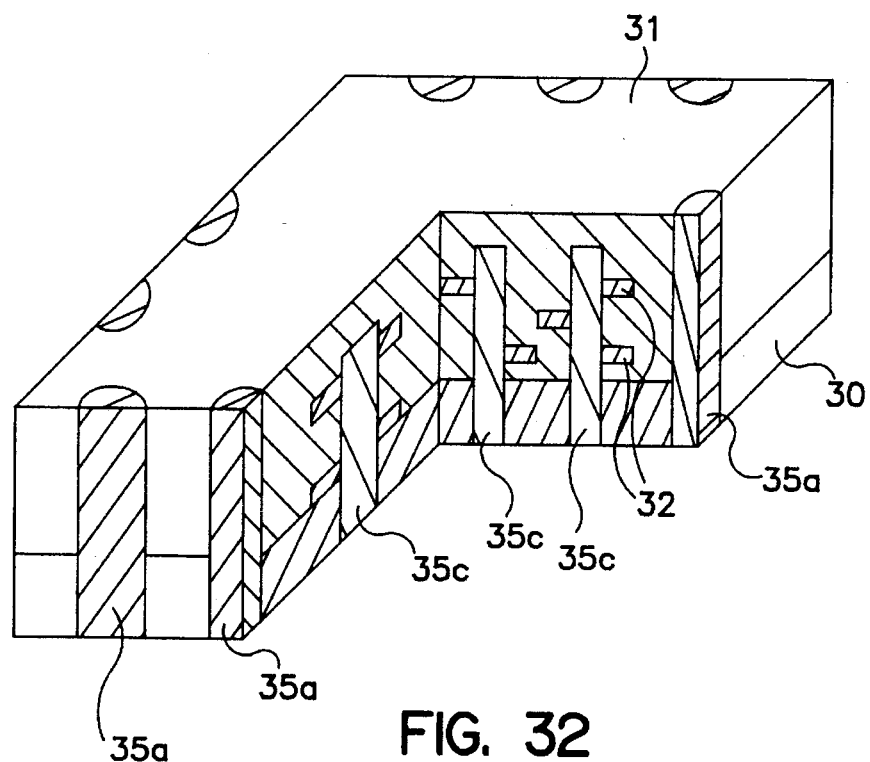
FIG. 32 is a partially broken perspective view of a ceramic electronic device of Example 5 according to the present invention.
Figure 33:
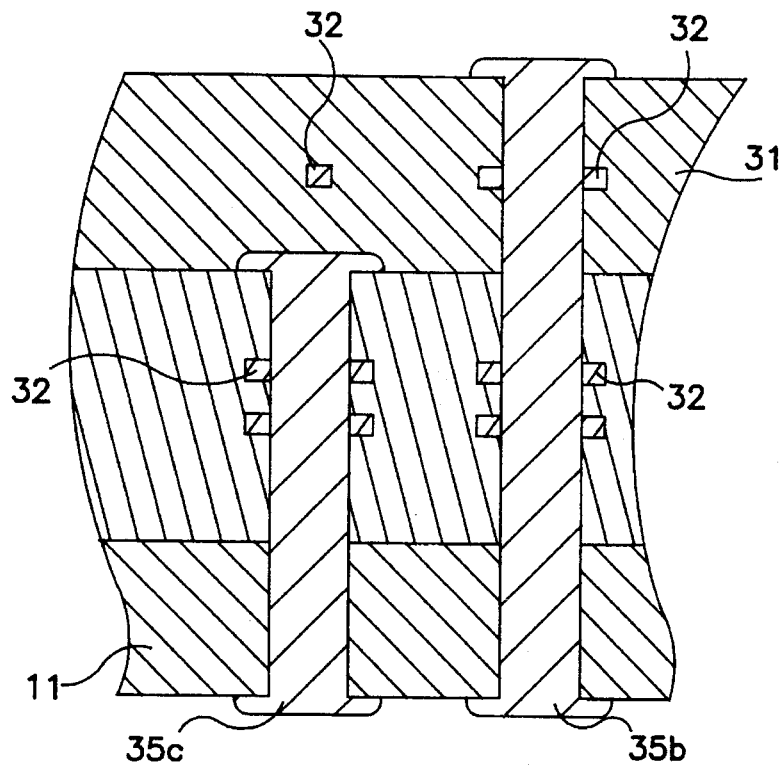
FIG. 33 is a cross-sectional view of electrodes of Example 5.

FIG. 32 is a perspective view of an array-type ceramic electronic device of Example 5 according to the present invention, Example 5 is differed from Example 4 by the fact that some of the through electrodes are restricted in length not to some out at one end. As shown, through electrodes 35c are shortened so that one end is exposed at the ceramic base 30 side while the other end stays in the ceramic layers structure 31. As the through electrodes 35c are exposed at one end, the array-type ceramic device is applicable to more versatile circuitry designs. FIG. 33 is a cross sectional view explaining two different types of the through electrodes; 35b is exposed at both ends and 35c is exposed only at one end.

Figure 34:
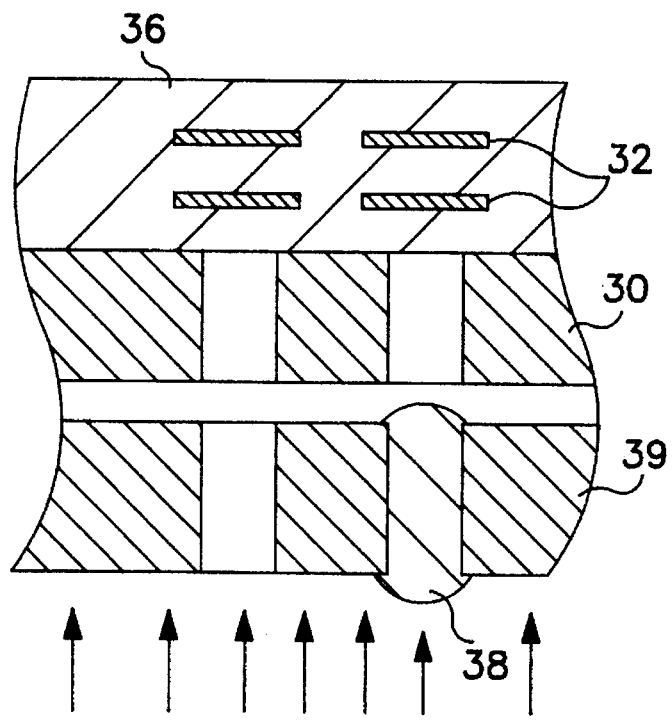
FIG. 34 is a cross-sectional view explaining a step of forming the electrodes of the same.
Figure 35:
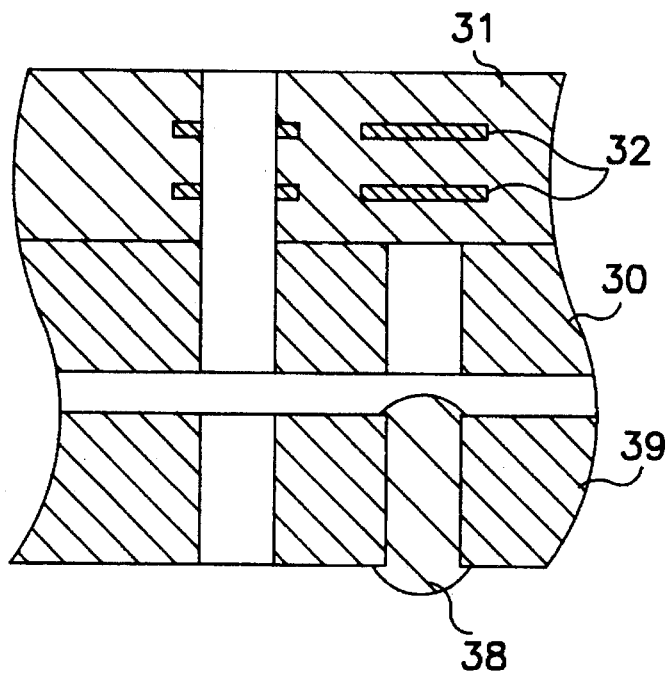
FIG. 35 is a cross-sectional view explaining another step of forming the electrodes of the same.
Figure 36:
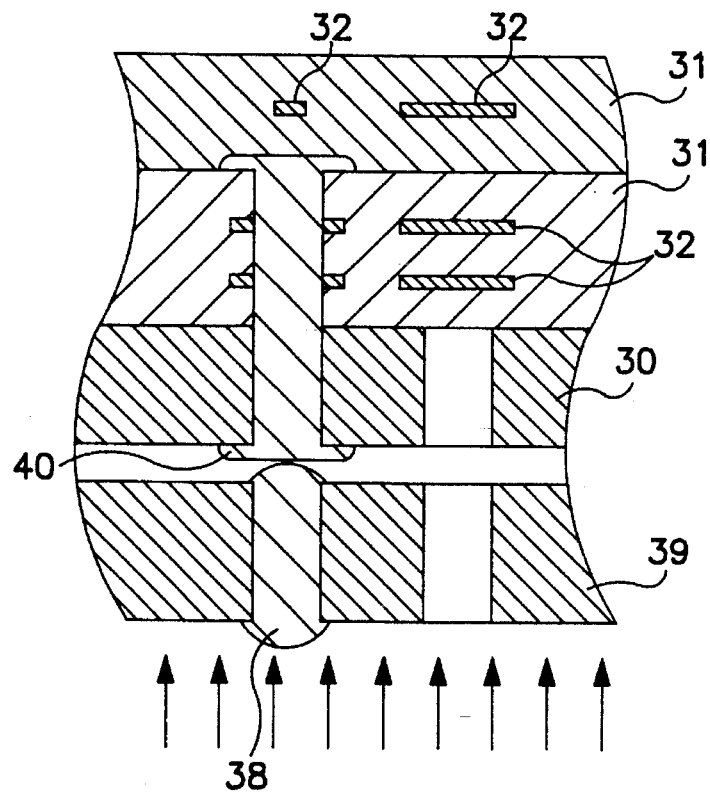
FIG. 36 is a cross-sectional view explaining a further step of forming the electrodes of the same.
Figure 37:
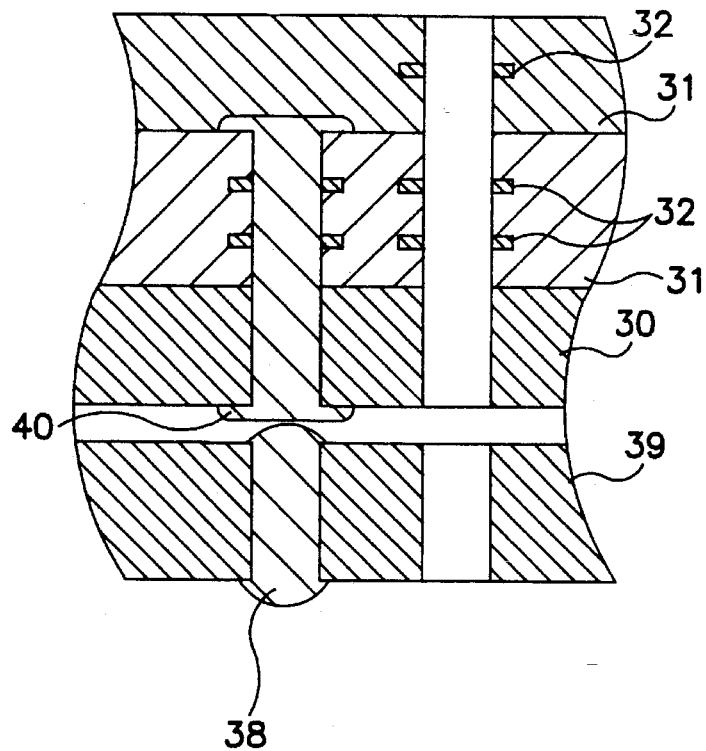
FIG. 37 is a cross-sectional view explaining a still further step of forming the electrodes of the same.

An example of the method of producing such one-end exposed through electrodes will now be explained referring to FIGS. 34 to 37. Additionally illustrated are a sealer 38, a masking 39, and an electrode material 40. After a green-form ceramic layers structure 36 encapsulating internal electrodes 32 is formed on a ceramic substrate 30, the masking 39 is set on one side of the ceramic substrate 30 where the green-form ceramic layers structure 36 is not present, as shown in FIG. 34. The masking 39 may be any applicable masking sheet such as a photosensitive dry film. This example however employs as the masking 39 a ceramic sheet which has a predetermined number of apertures therein and is made of the same material as of the ceramic substrate 30. Unwanted ones of the apertures of the masking 39 are closed off with the sealer 38 made of e.g. a rubber resin. Then, a sand blasting is applied from the direction indicated by the arrow marks. As the result, a desired number of through holes are produced in the green-form ceramic layers structure 36 while the sealer 38 prevents any sand blasting action, as shown in FIG. 35. After the through holes are filled with the electrode material 40, another green-form ceramic layer encapsulating internal electrode segments is formed on the upper surface of the green-form ceramic layers structure 36 constituting a green-form layers structure 31 as shown in FIG. 36. The masking 39 is set again with its through hole facing apertures closed off with the sealer 38 this time to protect the electrode material 40 filled in. A sand blasting is applied by the same manner to create complete through holes at desired locations in the green-form ceramic structure 31. As the result shown in FIG. 37, the portions of the green-form ceramic layers structure 31 which are protected by the sealer 38 remain intact due to the masking effect explained in FIG. 34. After filling the complete through holes with the electrode material 40 and baking the green-form ceramic layers structure 31, the array-type ceramic electronic device of FIG. 33 is obtained.

EXAMPLE 6

Figure 38:
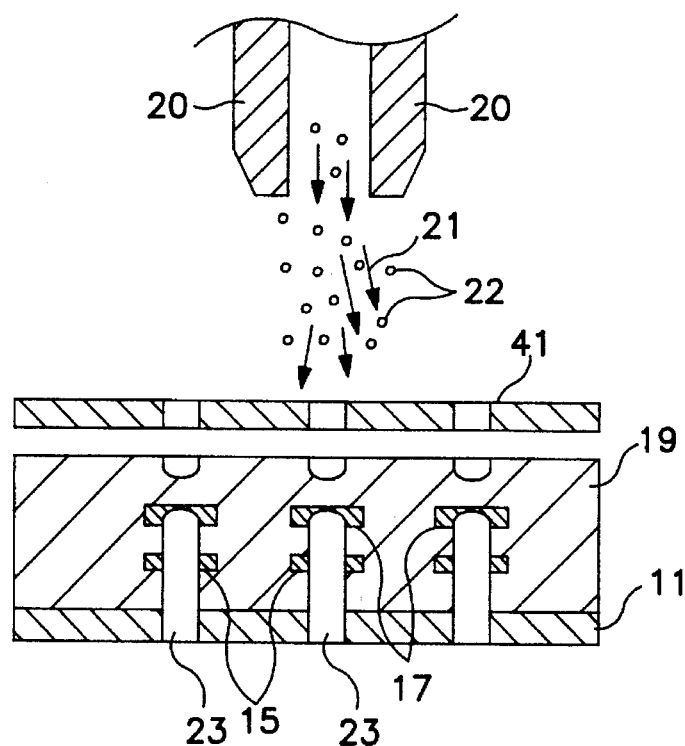
FIG. 38 is a cross-sectional view explaining a step of forming through holes in a green-form ceramic layers structure of Example 6 according to the present invention.

FIG. 38 is a cross sectional view showing Example 6 according to the present invention in which the making of through holes in a green-form ceramic layers structure conducted from both sides. A green-form ceramic layers structure 19 of FIG. 38 having holes 23 extended to a center region thereof is similar in construction to that shown in FIG. 12. As also shown, the green-form ceramic layers structure 19 is subjected to a sand blasting with a masking 41 to grind through holes from the other side where a ceramic substrate 11 is not present. This method reduces the operating time to below ½ thus increasing the productivity.

The method will be described in more details. The ceramic substrate 11 is a 7-cm square ceramic sheet having a given number of 0.5-mm diameter apertures arranged at intervals of 2.5 mm pitch (and will thus be referred to as a perforated ceramic substrate hereinafter). The perforated ceramic substrate is made by perforating and baking an alumina green sheet of which size has been determined to be identical the size of the finished substrate.

The perforated ceramic substrate is coated at upper surface with a 6-cm square full coating of a dielectric glass material using a common screen printing technique. Although small undulations appear on the glass coating due to the entrance of portions of the glass material into the apertures of the perforated ceramic substrate, they are definitely eliminated after repeating a print and dry process. As the result, the porous surface of the perforated ceramic substrate is completely covered with a 100-µm thickness of the dielectric glass coating (and will thus be referred to as a coated substrate hereinafter). The coated substrate is identical to a combination of a ceramic substrate and a ceramic green sheet (or more specifically, glass ferrite green sheet). The coated substrate is favorable in handling and accurate in dimensions due to the ceramic base and also, improved in compatibility with a printing ink due to the surface flatness of the green-form sheet.

Then, the coated substrate is coated with multiple layers by printing an internal electrode segment material (of silver palladium) and a glass ferrite ink alternately. As the result, a 5-turn coil pattern of the internal electrode is built in the green-form layers. The internal electrode encapsulating layers is then protected with a glass ferrite covering thus constituting a green-form ceramic layers structure 19.

Using a sand blasting machine, a blast of abrasive particles 22 are applied against the ceramic substrate 11 side of the coated substrate where the green-form ceramic layers structure 19 is not present. While the ceramic substrate 11 acts as a sand blast masking, most regions of the green-form ceramic layers structure 19 are not bitten by the abrasive particles 22. Exposed regions of the green-form ceramic layers structure 19 designated by the apertures of the ceramic substrate 11 are however ground out.

For reducing the processing time of this example, the sand blasting was examined for optimum effectiveness.

The abrasive particles were selected from aluminum grains ranging from 50 to 3000 mesh size. When the abrasive particles were as small as about 1500 mesh size, their kinetic energy was insufficient. When the blasting velocity was reduced, the abrasive particles were often trapped in the apertures of the ceramic substrate. When the abrasive particles were increased in the size, their kinetic energy became high increasing the etching or grinding speed. However, when the abrasive particles were too large, for example, 50 mesh size, they were not easily accepted by the ceramic substrate apertures and the grinding speed was declined.

It was taught that the size of the abrasive particles and the grinding speed depended much on the diameter of the ceramic substrate apertures. Through a series of experiments, the optimum size of the abrasive particles for sand blasting was found ⅓ to ⅕ the diameter of the ceramic substrate apertures.

More particularly, when the abrasive particles of 320 mesh size were shot from one sand blasting nozzle through the ceramic substrate apertures to the green-form ceramic layers structure of 1 mm thick, 2000 through holes of desired size (0.5 mm in diameter) in total were created within 100 seconds. Also, when the sand blasting was applied from both sides, 2000 of the 0.5-mm diameter through holes were produced in the same green-form ceramic layers structure within 30 seconds. It was taught that the greater the pressure of compressed air for blasting the abrasive particles, the higher the grinding speed. In practical application of the sand blasting machine, a pressure of $5 \times 10^5$ Pa (5 kg per square cm) to $10 \times 10^5$ Pa (10 kg per square cm) was most effective. When two or more sand blasting nozzles were used, the time required for the sand blasting became short.

For making the through holes of highly accurate dimensions, the sand blasting was first applied to the ceramic substrate side (the side of the ceramic substrate 11 in FIG. 38) of the green-form ceramic layer structure, not simultaneously at both sides, and to the other side with the masking 41 of FIG. 38 covering.

Then, the green-form ceramic layer structure having the through holes was baked together with the ceramic substrate thus turning to a ceramic densification.

EXAMPLE 7

Example 7 according to the present invention will now be described in which the sand blasting of the previous examples shown in FIGS. 12, 34, 36 and 38 is replaced with a water jet grinding method. The water jet grinding prevents the dispersion of grinding dust generated during the making of through holes.

The application of the water jet grinding will be explained in more details. The ceramic substrate was a ceramic sheet (of 80×55 mm and 0.635 mm thick) having score lines arranged therein for an array-type electronic device size of 3.2×6.4 mm. The apertures of the ceramic substrate were 0.4 mm in diameter and arranged at intervals of 1.27 mm pitch across and along the score lines for making external electrodes (and will thus be referred to as external electrode holes hereinafter). It was designed that the array-type ceramic electronic device produced by cutting the ceramic substrate apart along the score lines has 12 external electrodes, two at each short edge and four at each long edge.

A predetermined number of layers of common glass insulation ink and of commercially available silver palladium conductive ink were printed one over the other on the ceramic substrate by a known screen printing method, thus forming a green-form ceramic layers structure. Each layer incorporated a pattern of the insulation or conductive ink so that the external electrode apertures of the ceramic substrate were filled with the printing ink. The internal electrode encapsulated in the green-form ceramic layers structure was 100 μm in width and the bare holes in the insulation layer were 200 μm in diameter.

The patterns determined with tens of printing screens for the insulation ink and the conductive ink respectively were printed on the ceramic substrate so that the internal electrodes were developed in six layers.

Each printed layer was dried at 100° C. for 10 minutes. For prevention of interlayer short-circuit, the insulation layers were added by repeating a print and dry process. As the external electrode holes were filled with the conductive ink at each step, a fresh layer surface for printing always appeared in flatness like the upper surface of the ceramic substrate. Accordingly, common external electrode hole related disadvantageous events including printing interference, ink flow, and ink aggregation around the hole were avoided.

The green-form ceramic layers structure was then subjected to the water jet grinding. As understood, the water jet grinding was applied to the ceramic substrate side and with the ceramic substrate acting as a masking, desired regions of the green-form ceramic layers structure exposed through the external electrode holes of the ceramic substrate were ground off. The grinding action was effected due to a difference in mechanical strength between the ceramic substrate and the insulation and conductive ink layers. As the result, a desired number of through holes communicated to the apertures of the ceramic substrate such as shown in FIG. 13 were created in the green-form ceramic layers structure.

An amount of external electrode ink was then applied to the through holes in the green-form ceramic layers structure by the through-hole printing technique explained previously with FIGS. 15 and 16, using a common screen printer equipped with a through-hole printing vacuum system. Although the procedure of this embodiment employed the through-hole printing of external electrodes, other techniques may be used to produce the external electrodes of a particular type, e.g. the solid shape shown in FIG. 23.

Finally, the green-form ceramic layers structure on the ceramic substrate having the external electrodes produced by the through-hole printing was cut into pieces and baked at 850° C. As the result, a multi-layer ceramic device similar to that shown in FIG. 22 was produced.

For comparison, a like ceramic device was produced from a multi-layer green-form developed while the external electrode holes of its ceramic substrate remaining not filled with printing ink. The ceramic substrate and the printing ink were identical to those of the previous procedure. During printing, the insulation or conductive ink tended to flow into the external electrode holes of the ceramic substrate thus preventing implementation of the through-hole printing. It was thus needed to design the patterns for electrode ink carefully so that there were no insulation or electrode material about the external electrode holes. This means that each pattern has to be spaced at least 200 μm from the holes. In practice, the ceramic device of this procedure requires a circle margin area of 0.8 mm diameter to be spared around each external electrode hole (including the 0.4 mm diameter hole space and a 0.2 mm width margin about the hole space). A sum of the circle areas for all the twelve external electrodes occupies about 12.7% of the entire device surface. In other words, only 87.3% of the device size is available for functional design.

The device produced by the method of the seventh embodiment is however claimed as small as 3.2% by the external electrode installation and thus, allows 96.8% of the entire size to be utilized for functional requirements. The smaller the surface area or the more the number of the external electrodes, the more the device according to the present invention is favored, as compared with a conventional device.

The device produced by the method of this example rather than a conventional sheet layer forming method is suited for high density circuit arrangement. Also, it has a ceramic base thus minimizing the shrinkage in baking and increasing the productivity.

EXAMPLE 8

Example 8 according to the present invention will be described referring to FIG. 39. In particular, a ceramic substrate 30 in this example is sandwiched between two ceramic layers structures of different materials which are a ferrite layers structure 42 and a dielectric covering 43 made mainly of a leaded dielectric material. As also shown, capacitor electrodes 44 are arranged to face each other through the dielectric covering 43 thus constituting capacitors. Internal electrodes 45 are arranged in a coil form in the ferrite layers structure 42 and coupled to through electrodes 46. The through electrode 46 is coupled at one end to the internal electrode 45 and at the other to the capacitor electrode 44 mounted on the outer side of the ceramic substrate 30. The ceramic substrate 30 serves as a diffusion preventing layer thus minimizing a declination in the characteristic capability caused by diffusion.

A method of producing the above multi-layer construction will be explained in more details. The ceramic substrate 30 is coverted at upper surface with a green-form ceramic sheet of 0.4 mm thick made mainly of a glass ferrite material. Then, a layer of silver palladium electrode ink is printed over the greem-form ceramic sheet. After the two actions explained with FIGS. 5 to 8 are repeated, the glass ferrite green-form ceramic layers structure 42 is produced encapsulating the internal electrodes 45 of a 20-turn coil form.

Then, through holes are created in the green-form ceramic layers structure 42 and filled with the electrode ink, as shown in FIGS. 28 to 30. After baking at 950° C., an array-type ceramic electronic device such as shown in FIG. 26 is produced.

Figure 39:
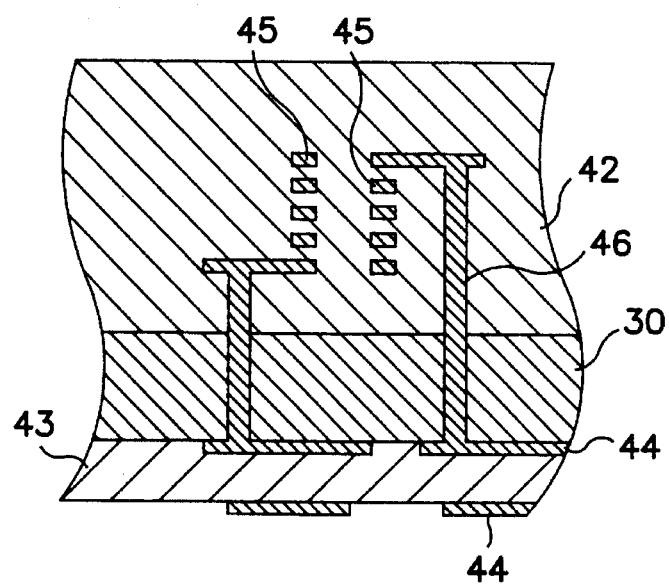
FIG. 39 is a cross-sectional view of a green-form ceramic layers structure of Example 8 according to the present invention.

A capacitor layer is added to the lower surface of the ceramic device (where the ceramic substrate 30 is exposed) and baked at 700° C., thus finishing the multi-layer construction of FIG. 39. It is known that for lowering the baking temperature of a dielectric material or for increasing the dialectric constant, a lead material (namely, PbO) is added to the dielectric material. The lead material however tends to diffuse during the baking and will thus impair the characteristics of a ceramic material such as ferrite. The ceramic device of Example 8 allows the ceramic substrate 30 to act as the diffusion preventing layer. In fact, experimental ceramic electronic devices produced by the method of this example prove that their ferrite coil characteristics and dielectric capacitor capability are identical to those of like ferrite devices and dielectric capacitors respectively.

In another experiment, a comparison ceramic device similar to that shown in FIG. 39 but without the ceramic substrate 30 was produced and found that it failed to have equal characteristics. It verifies that the ceramic substrate 30 is essential to prevent the diffusion. Also, the comparison devices without the ceramic substrate 30 were examined for mechanical strength using the EIAJ test (RCX-0104/104). Their strength to breakage was less than a half the strength of the device of the present invention which has the diffusion preventing ceramic substrate 30. Since the ceramic substrate 30 contributes to the rigidity of the ceramic electronic device, the method of Example 8 will be advanageous in developing array-type or composite ceramic electronic devices for simplicity of a mounted circuit and in reducing the thickness of the ceramic layers section of any ceramic device for cost saving.

EXAMPLE 9

Figure 40:
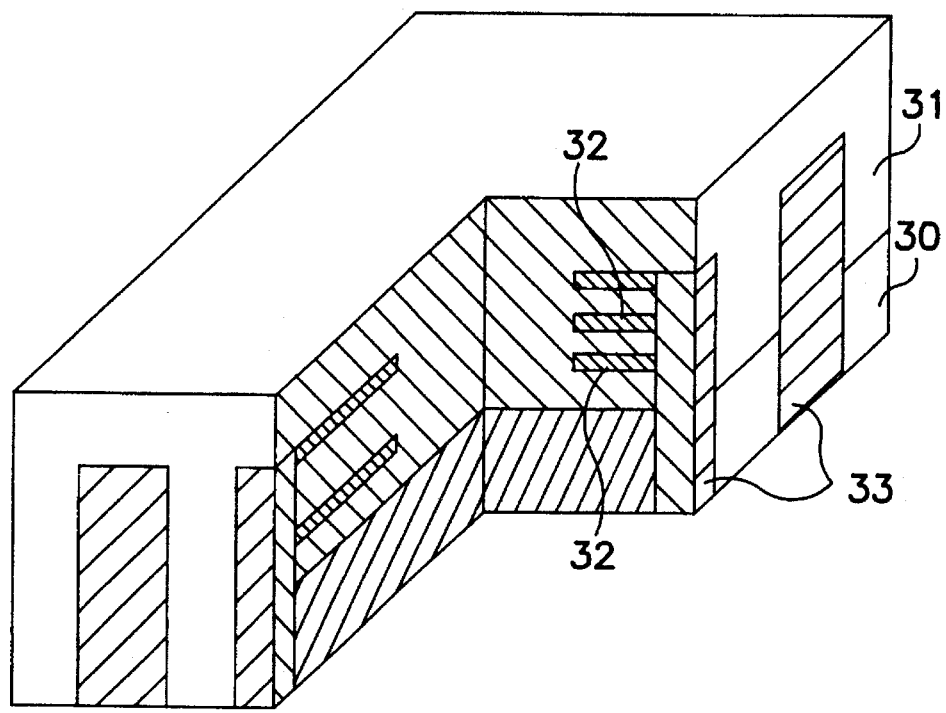
FIG. 40 is partially broken perspective view of a ceramic electronic device of Example 9 according to the present invention.

Example 9 according to the present invention will be described referring to FIG. 40 in which external electodes 33 extend from the lower surface to an intermediate but not to the upper surface of a ceramic device. Example 9 is differed from Examples 1 to 8 by the fact that the external electrodes are arranged to a minimum length. As shown, the external electrodes 33 are embedded in a ceramic layers block 31 and not extened to the upper surface of the ceramic device.

It is known that the upper surface of electronic devices has to be as flat as possible for increasing a working speed or accuracy in the mounting action because the electronic devices are generally picked up by suction of a vacuum nozzle of a component mounting apparatus. The upper surface of the ceramic electronic device of Example 9 is isolated from the external electrodes and will thus contribute to the ease of mounting operation and the downsizing of the device. Also, it will be favorable in improving the identification of the mounted device during inspection.

The external electrodes of this example can be fabricated by the through electode producing method described with FIG. 32.

EXAMPLE 10

Figure 41:
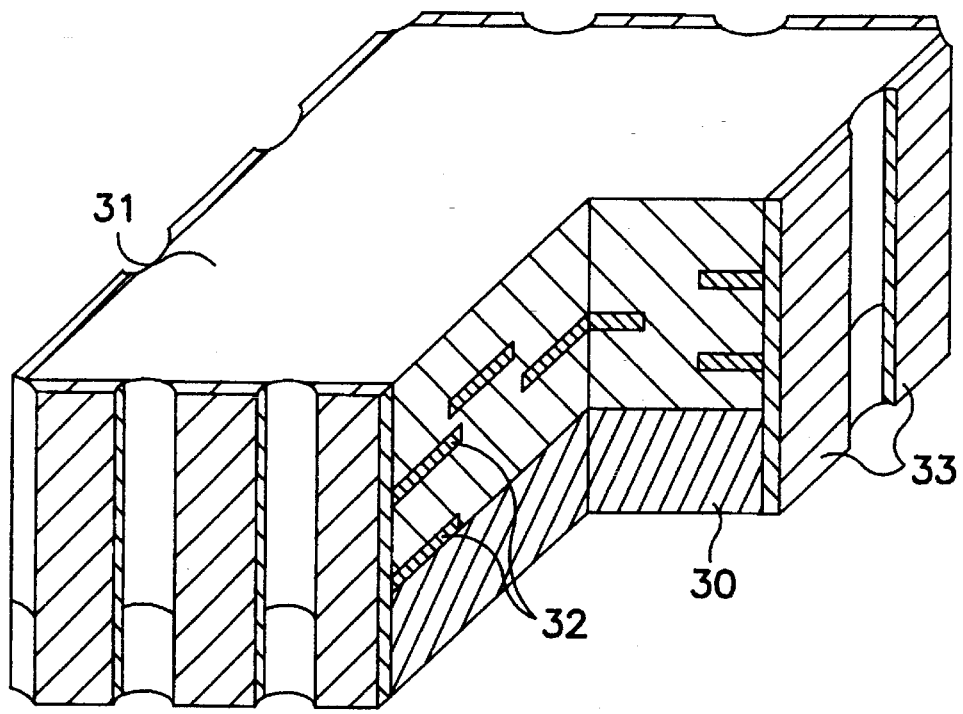
FIG. 41 is partially broken perspective view of a ceramic electronic device of Example 10 according to the present invention.
Figure 42:
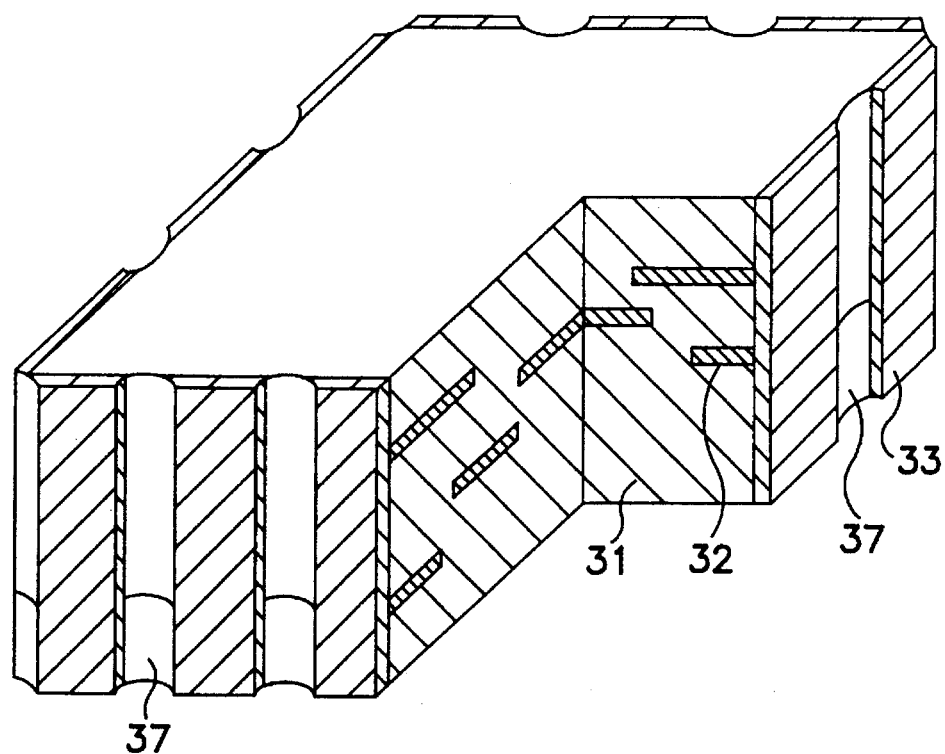
FIG. 42 is partially broken perspective view of another form of the ceramic electronic device of Example 10.

Example 10 according to the present invention will be described referring to FIGS. 41 and 42. As shown, the external electrodes 33 of this example are formed on the side surfaces between through hole recesses 37 of a ceramic device while the external electrodes of Examples 1 to 9 are installed in the through holes. FIGS. 41 and 42 are explanatory views showing the external electrodes 33 formed out of and between the through hole recesses 37. FIG. 41 illustrates including a ceramic base 30 but FIG. 42 excluding the same. in production, the side surfaces of the device where the external electrodes 33 are built are raised as the counter regions of the recesses 37 so that an external electrode material can easily be applied to the side surfaces without using the through-hole printing method. The application may be implemented by coating a 5 to 30 μm thickness layer of the external electrode material on a rubber resilient member with a bar coater or applicator and transferring it onto the raised side surfaces of a ceramic layer block 31 which being pressed against the rubber member. Since the external electrode material layer is separately distributed on the rubber resilient member, it will compensate in-process faults on the ceramic layers block 31 including a differnce between the score line and the dicing line and a dimensional divergence from the ceramic base 30.

The through hole recesses 37 may be created in a green form of the ceramic layers block 31 after dicing while the ceramic bake 30 serving as a masking. More specifically, a sheet of the green-form ceramic layers is cut along the score lines and the external electrode material is poured into the diced slits. When the through holes are made in across and along the slits, a lattice of the external electrode material is separated into pieces. Then, if the ceramic base 30 is removed, the device shown in FIG. 42 is obtained.

When the green-form ceramic layer sheet is cut apart across and along rows of the through holes, internal electrodes 32 in the ceramic layer block 31 are exposed at the side surfaces between the through hole recesses 37. In other words, the internal electrodes 32 are well protected and not exposed before being directly connected to the external electrodes 33 upon forming of the external electrodes 33. Accordingly, possible oxidation or delamination of the internal electrodes 32 will be minimized during production of the ceramic electronic devices.

EXAMPLE 11

Example 11 according to the present invention will now be described in which a green-form ceramic layers sheet is formed on a substrate provided with no apertures and after making a given number of apertures in the substrate, subjected to generation of through holes using the apertures of the substrate. The green-form ceramic layers sheet comprises green sheet layers which can also be perforated with ease. It should be noted that the green-form ceramic layers sheet can be formed on a substrate which is provided with apertures. The green-form ceramic layers sheet may also comprise layers of resin film and a ceramic green sheet.

More specifically, a 30-μm thickness layer of green form ceramic is developed with a reverse coater on a resin or polyester film of 75 μm thick which has no apertures. The polyester film is exposed through a given masking to an excimer laser radiation for having a multiplicity of apertures of 50 to 208 μm diameter plotted at a density of 400 pieces per square centimeter. The excimer laser radiation is so adjusted that the polyester film only is perforated while the green-form ceramic layer remains intact. The green-from ceramic layer is subjected to sand blasting of a sand blasting apparatus while the perforated polyester film acts as a masking for making through apertures. Then, a bare printing and an internal electrode ink printing are applied over green-form ceramic layer having the through apertures. After repeating this sequence of actions a predetermined number of times and baring a resultant green-form ceramic layers sheet, a ceramic multi-layer circuit board is completed.

In Examples 11, the perforating can be implemented at one step regardless of the size of diameter and the density of apertures without using specific toolings. More particularly, it is possible to have as a high density as 50 apertures per square centimeter or as a small aperture diameter as below 100 μm. Also, the perforated polyester film may be used as a masking for the bare printing as well as the green sheet perforating.

The polyester film may be perforated using YAG laser or carbon dioxide laser rather than the excimer laser.

The green sheet layer on the polyester film may be perforated by sand blasting through a specified this sand blasting step, it is preferred to perforate the polyester film together with the green sheet layer because the apertures of the polyester film can be utilized in the succeeding bare printing step. For perforating both the green sheet layer and the polyester film simultaneously, thickness of the polyester film is preferably less than 100 μm. If the diameter of the apertures is small and the accuracy of the perforating is crucial, the polyester film thickness is preferably less than 50 μm.

Abrasive particles of the sand blasting may be prepared from the same ceramic material as of the green sheet layer, thus preventing the introduction of impurities.

EXAMPLE 12

Figure 43:
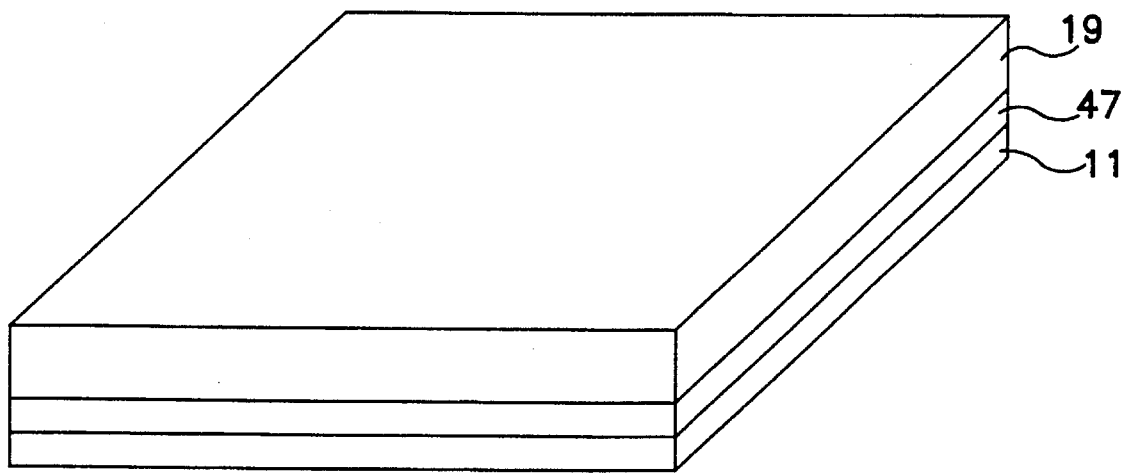
FIG. 43 is a perspective view showing a step of producing an array-type ceramic electronic device of Example 12 according to the present invention.
Figure 44:
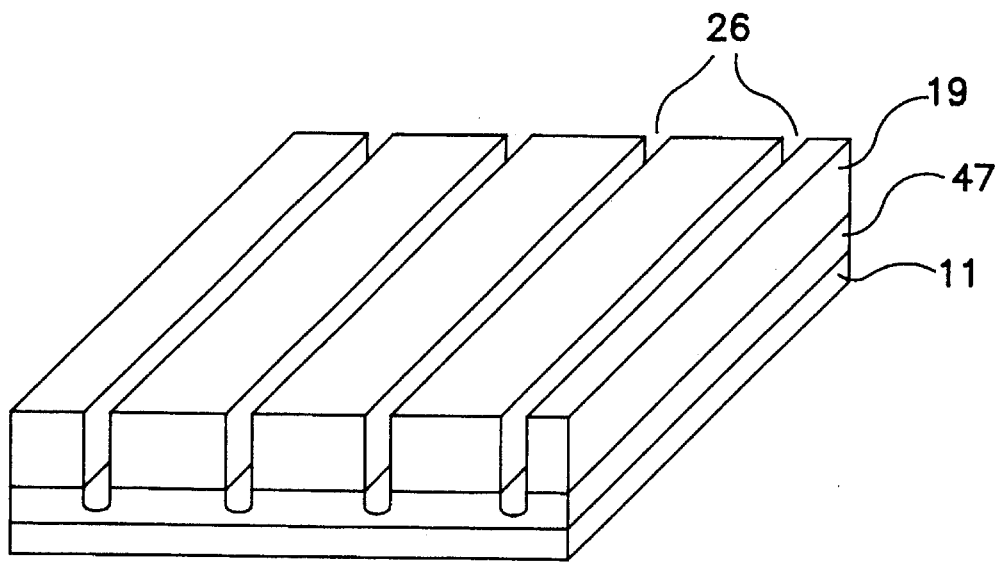
FIG. 44 is a perspective view showing another step of the same.
Figure 45:
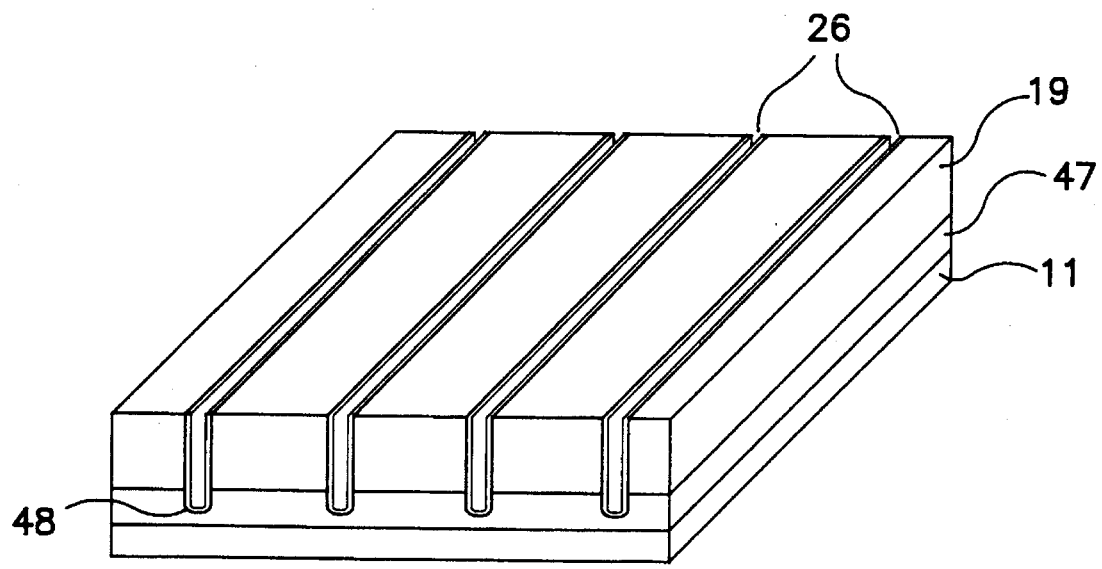
FIG. 45 is a perspective view showing a further step of the same.
Figure 46:
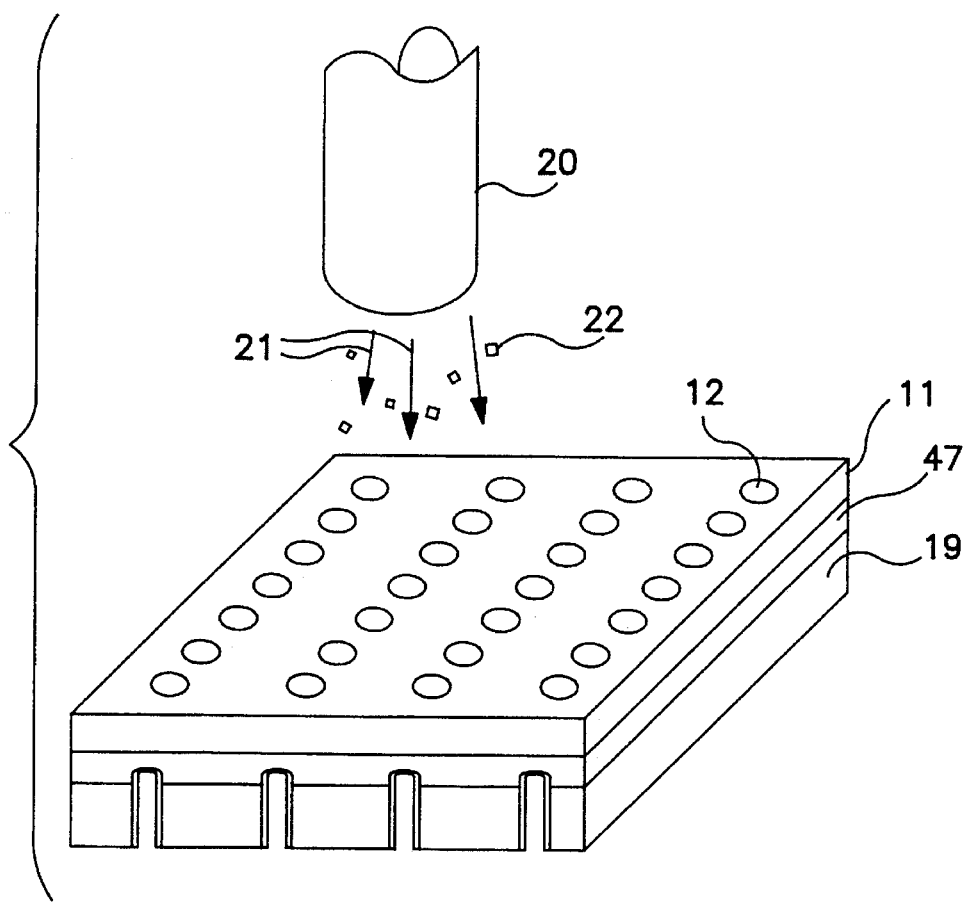
FIG. 46 is a perspective view showing a still further step of the same.
Figure 47:
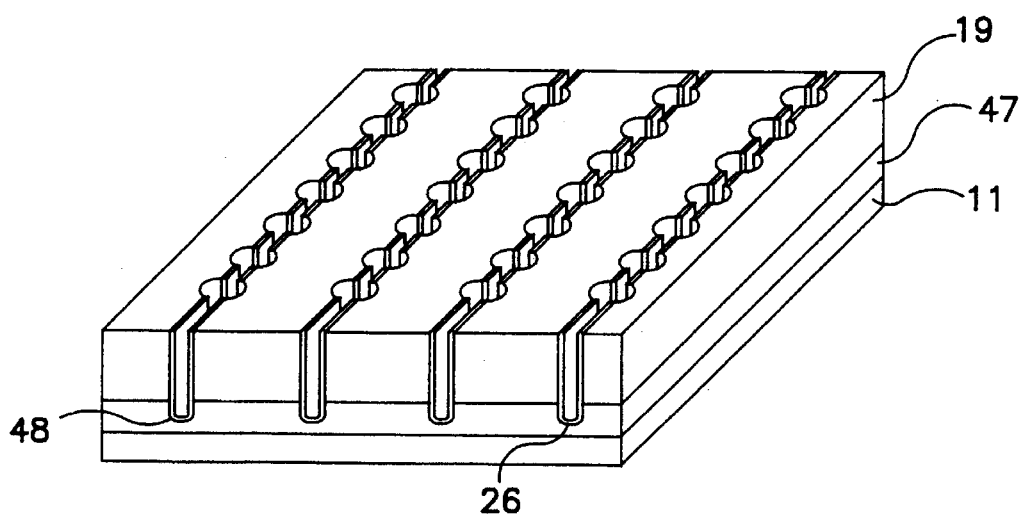
FIG. 47 is a perspective view showing a still further step of the same.
Figure 48:
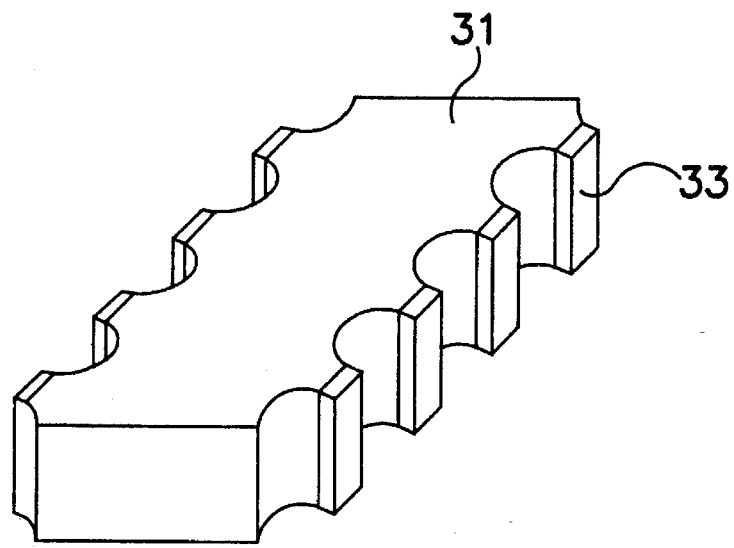
FIG. 48 is a perspective view of the array-type ceramic electronic device of Example 12.

Example 12 according to the present invention will be described referring to FIGS. 43 to 48. The method of this example incorporates forming external electrodes on raised regions of a ceramic layers structure on a substrate. As shown in FIG. 43, a green-form ceramic layers structure 19 is bonded by an adhesive layer 47 to a ceramic substrate 11. It should be noted that the green-form ceramic layers structure may encapsulate internal electrodes on the substrate having apertures therein so that the internal electrodes are aligned with corresponding apertures of the substrate. The green-form ceramic layers structure 19 is then cut to have dicing slits 26. The dicing slits 26 are sunk deep but not to the ceramic substrate 11 which remains intact. As shown in FIG. 45, an amount of external electrode material ink is poured into the dicing slits 26 forming rows of external electrode walls 48. A blast of abrasive particles 22 is then applied from a nozzle 20 to the ceramic substrate 11 turned upside down, as shown in FIG. 46. As the ceramic substrate 11 has a predetermined number of apertures 12 therein, the adhesive layer 47 and the green-form ceramic layers structure 19 are hollowed through at the locations exposed through the apertures 12 of the ceramic substrate 11. As the result, each external electrode wall 48 is divided by a row of the through holes. After removal of the adhesive layer 47 and baking the green-form, a ceramic electrode device is obtained having a ceramic layers block 31 covered at its side raised surfaces with external electrodes 33 as shown in FIG. 48.

The adhesive layer 47 may be formed of a resin material which is foamable with heating. Such a formable layer is built to 0.1 to 500 μm of a thickness as the resin material will be inflated 2 to 10 times by heating. The formable resin layer is also covered at upper surface with the green-form ceramic layers structure 19 so that it is sandwiched between the ceramic substrate 11 and the green-form ceramic layers structure 19. This arrangement allows the green-form ceramic layers structure 19 to be cut by dicing into pieces without injuring the ceramic substrate 11. Then, when the foamable resin layer is heated at 120° C., it inflates to remove pieces of the green-form ceramic layers structure 19 from the ceramic substrate 11. The ceramic substrate 11 remains intact and will be reused ensuring a reduction in the production cost. The ceramic substrate 11 may be replaced with a hard metal or cemented carbide plate which is higher in dimensional precision and easily machined to have pin holes for ease of installation and transfer, thus contributing to the automatic operations.

Figure 49:
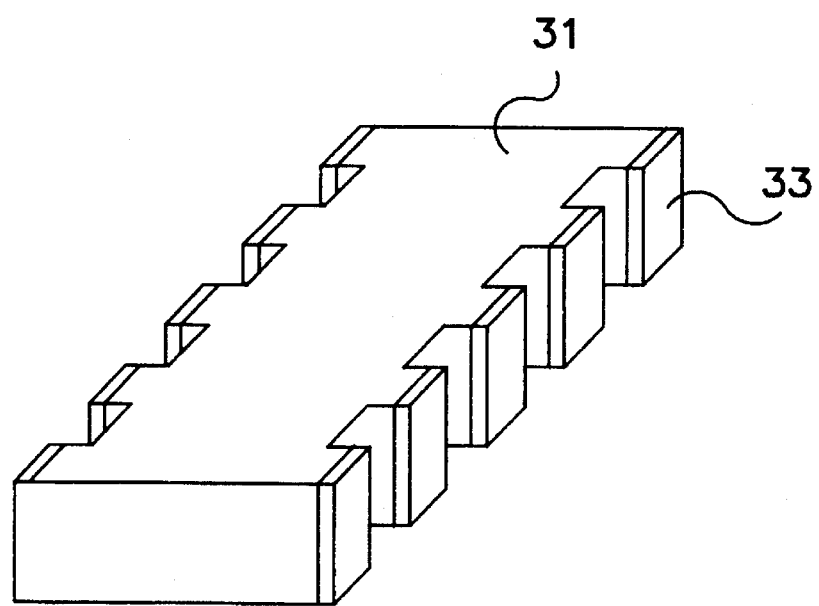
FIG. 49 is a perspective view of another form of the array-type ceramic electronic device of Example 12.

When the apertures 12 of the ceramic substrate 11 are arranged of a square configuration, another appropriate shape of the ceramic electronic device is obtained as shown in FIG. 49.

The ceramic electronic device of Example 12 has its side surfaces arranged with a recessed region and a raised region alternately as any two external electrodes 33 are located on both sides of the recessed region and will be advantageous in the mounting by soldering.

EXAMPLE 13

Figure 50A:
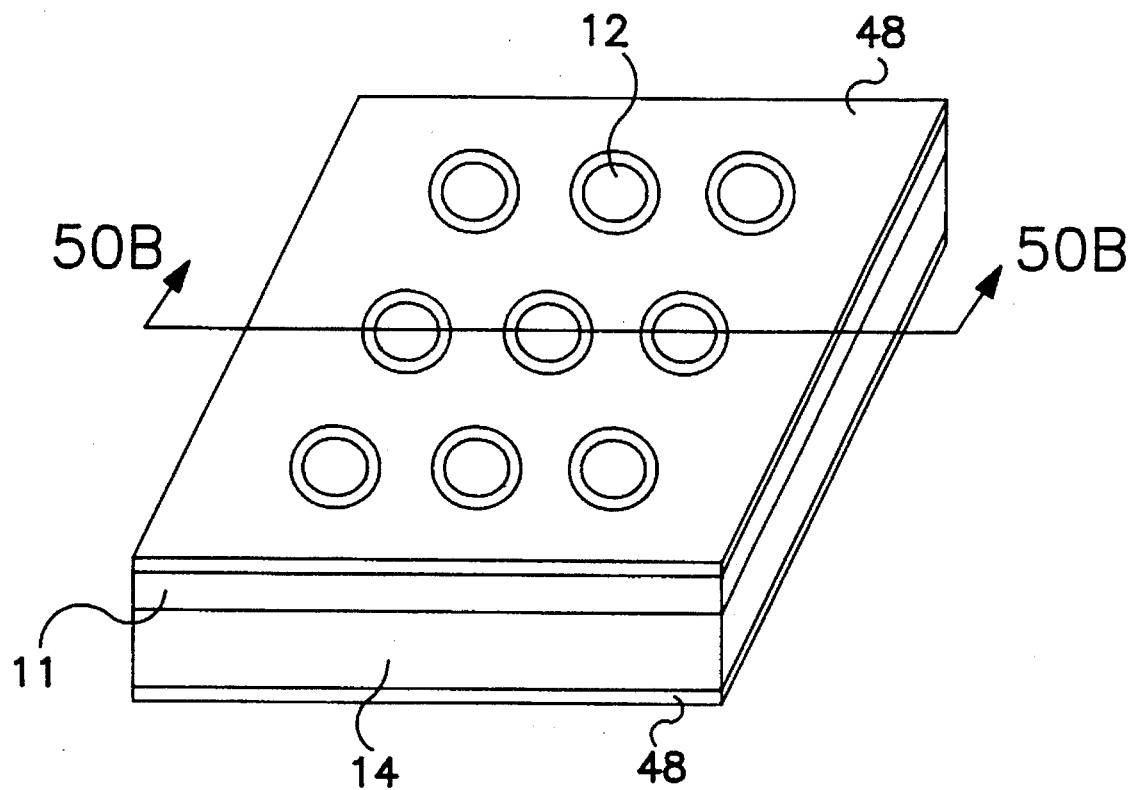
FIGS. 50(A) and 50(B) illustrate a perspective view and its 50B—50B cross-sectional view explaining a step of forming external electrodes of Example 13 according to the present invention.
Figure 50B:
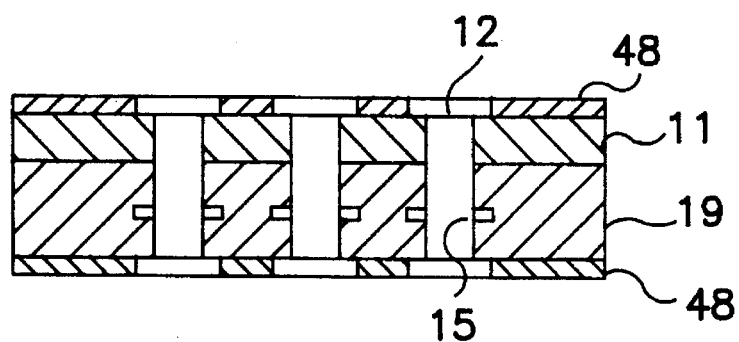

Example 13 according to the present invention will be described referring to FIGS. 50 to 52 in which the external electrodes are formed in the through holes by a plating technique. As shown in FIG. 50, a green-form ceramic layers structure 19 and a ceramic substrate 11 are coated with resist layers 48 except the through holes 12. Then, when the exposed surfaces where the resist layers 48 are not present are plated with a proper material, resultant platings 49 turn to the external electrodes as shown in FIG. 51 without using the through-hole printing method.

The external electrodes can also be made by placing core metals, in place of the platings 49, and then plating over the core metals. The resist layers 48 may be formed of a glass material as well as a common resin material.

Figure 52A:
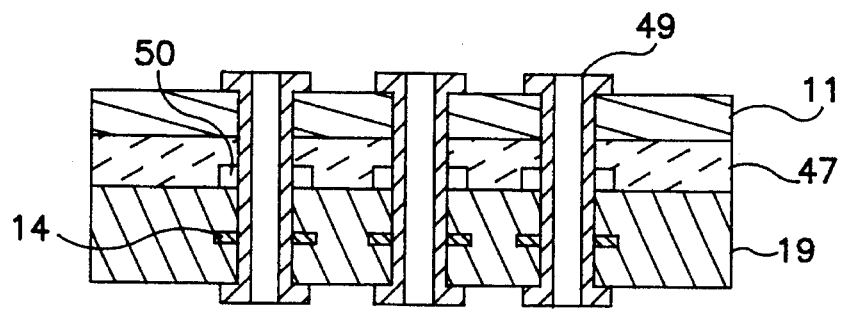
FIGS. 52A and 52B illustrate further views explaining further steps of forming the same.
Figure 52B:
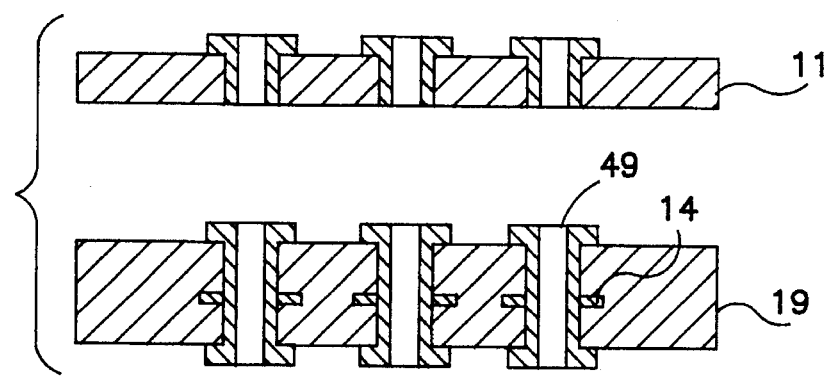
Figure 53:
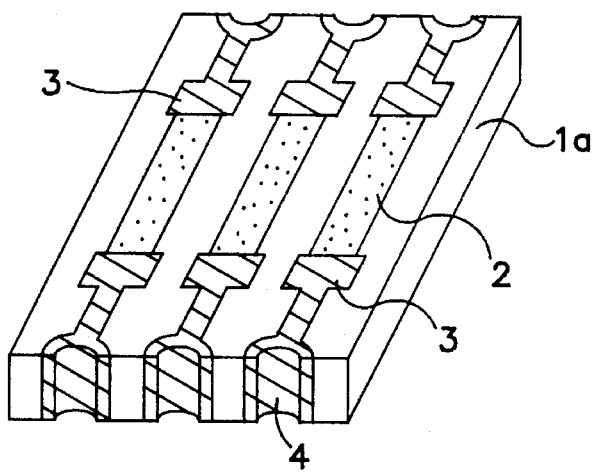
FIG. 53 is a perspective view of a conventional ceramic electrode device.
Figure 54:
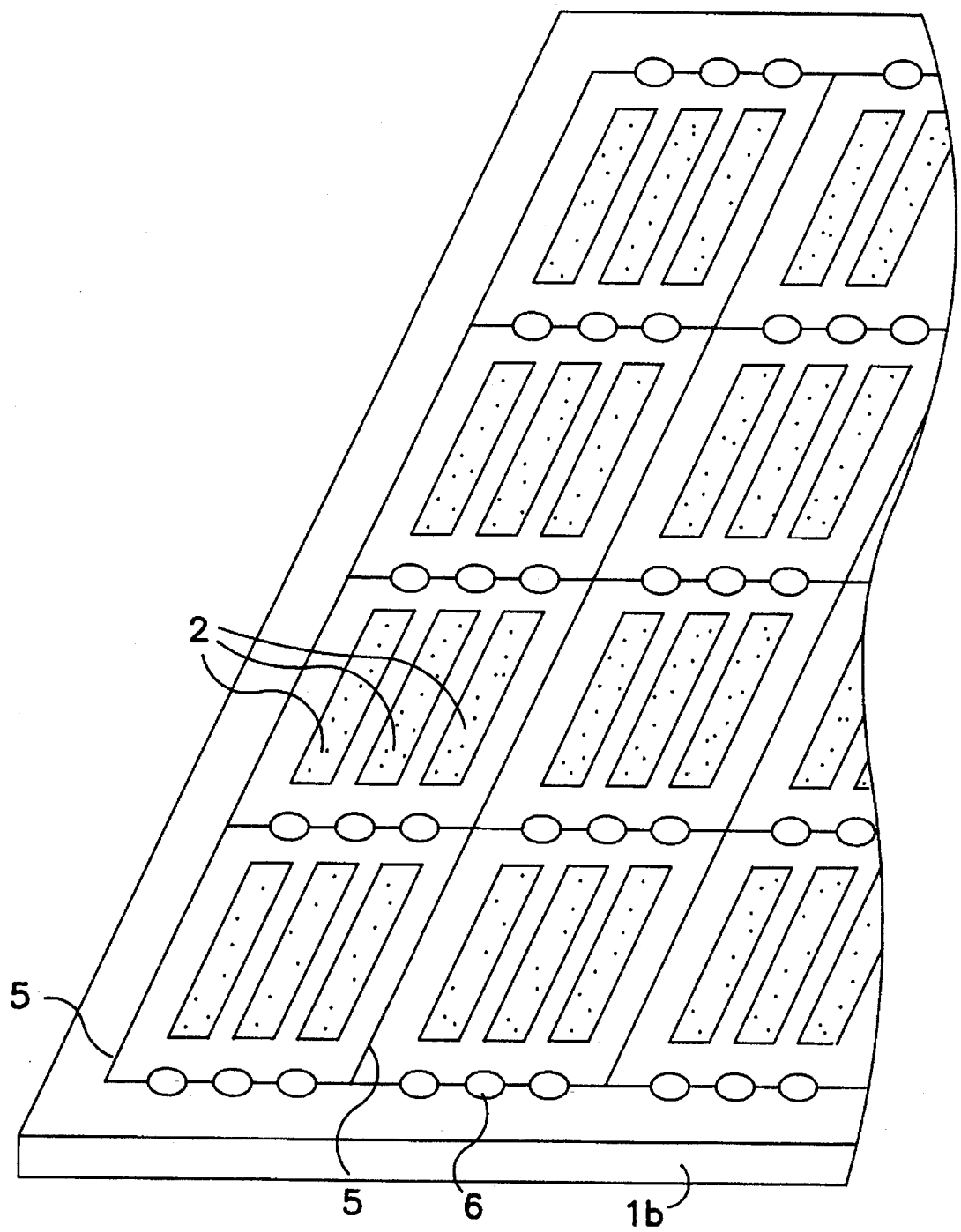
FIG. 54 is a perspective view showing a step of forming the conventional ceramic electronic device.
Figure 55:
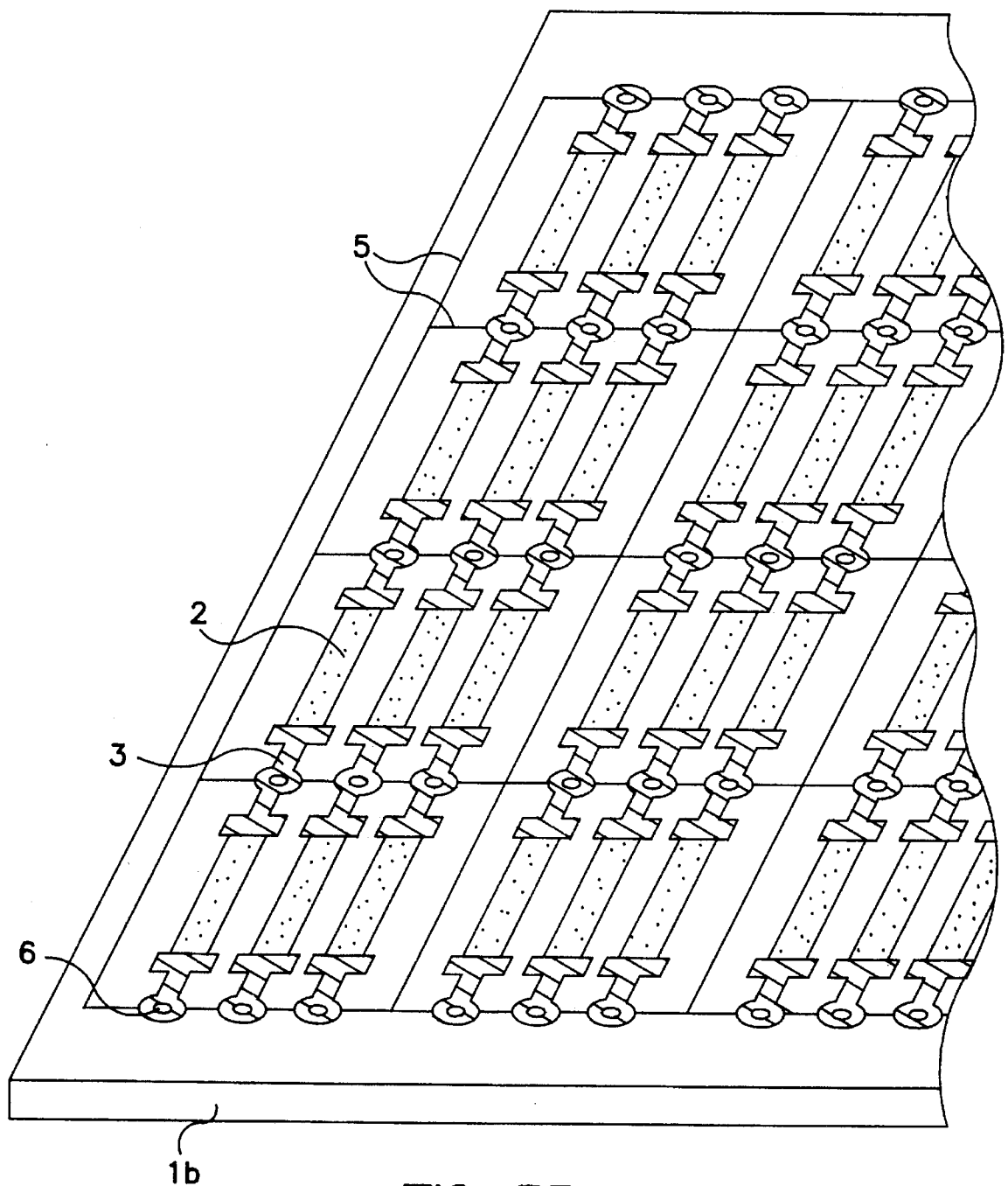
FIG. 55 is a perspective view showing another step of forming the same.

It is a good idea that an adhesive layer 47 in which external electrode segments 50 are allocated is provided between the green-form ceramic layers structure 19 and the ceramic substrate 11, as shown in FIG. 52(A). After the adhesive layer 47 is removed, the segments 50 become parts of the external electrodes 49 as shown in FIG. 52(B).

Figure 51A:
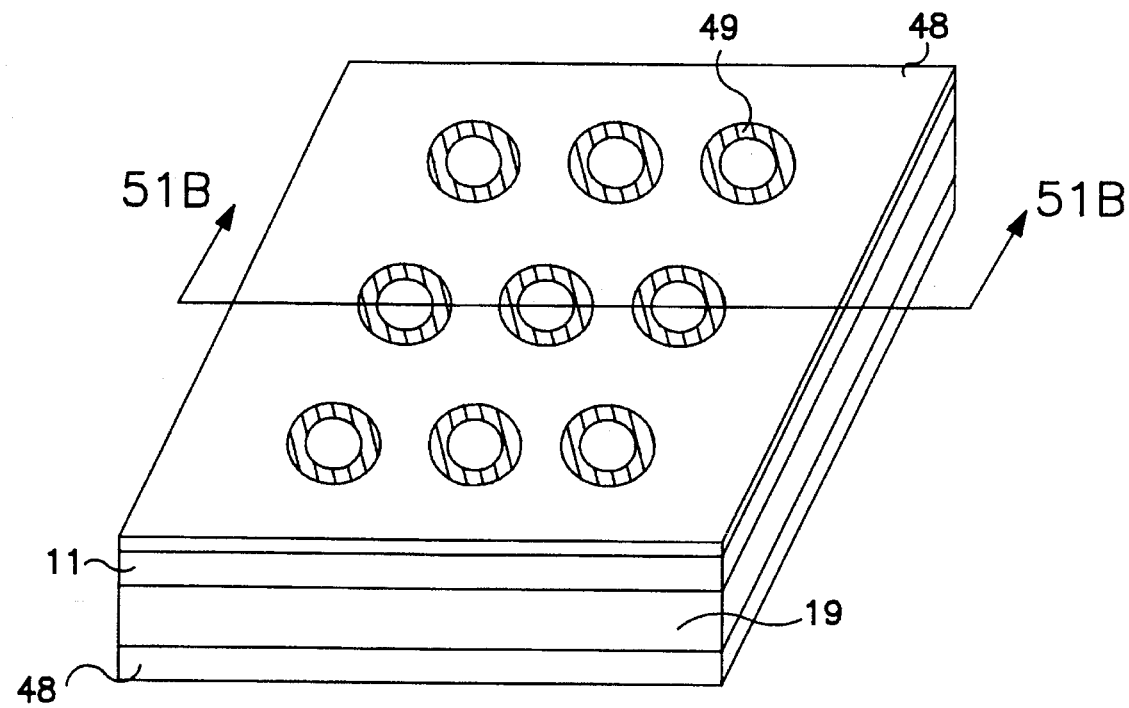
FIGS. 51(A) and 51(B) illustrate a perspective view and its 51B—51B cross-sectional view explaining another step of forming the same.
Figure 51B:
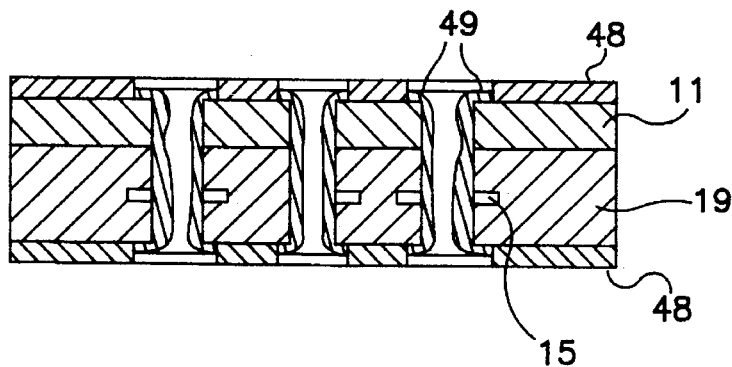

In the process of forming the external electrodes in the through holes, the platings 49 explained with FIGS. 50 to 52 may be developed after the green-form ceramic layers structure 19 is baked or using a nonelectrolyte plating method. The nonelectrolyte plating is equally applicable to recessed surfaces without difficulty, as compared with a traditional electric plating. Also, using the nonelectrolyte plating method, the external electrodes made from silver or silver paradium can be plated with layers of nickel and gold thus enhancing the soldering infallibility.

When the external electrodes are raised as shown in FIG. 48, a low-cost barrel plating method can be used. The barrel plating permits the external electrodes to be plated with desired shapes of nickel or other inexpensive soldering material. Since the external electrodes of the embodiment are spaced by recesses, any short-circuit derived from a plating fault will be avoided.

The forming of the external electrodes shown in FIGS. 50 to 52 may be implemented by a spraying, electrodeposition, dipping, or other technique than the plating.

EXAMPLE 14

Example 14 according to the present invention will now be described. The green-form ceramic layers structure of this example is first subjected to primary baking (referred to as first baking hereinafter), to making of the through holes, and after the through holes are filled with an electrode material, to main baking (referred to as second baking hereinafter, which is higher in baking temperature than the first baking), as compared with the green-form ceramic layers structure being perforated prior to being baked in Examples 1 to 13. The making the through holes may be carried out by any appropriate method selecting from sand blasting, water jet cutting, laser cutting, drilling, etc.

In this example, a ceramic layers structure to be processed is prepared by the first baking of its green-form (more precisely, a green-form ceramic layers structure encapsulating internal electrodes) arranged on a ceramic substrate at a temperature of 700° to 800° C. and is thus low in the mechanical strength to allow machining. In experiment, a sample green-form was first baked at 750° for one hour, subjected to a sand blasting in which abrasive particles are applied to the ceramic substrate side, and baked again at 950° for one hour for sintering.

A resultant ceramic layers structure was examined for frequency and impedance characteristics attributed to the noise attenuation capability. The results were as good as of those of the green-form before subjecting to the first baking. For the purpose of comparison, the first baked ceramic layers structure was second baked to increase its mechanical strength or rigidity to a given rate and then, processed by the sand blasting. As apparent, the resultant through holes were unfavorable in dimensions and shape. It is understood that poor sand blasting effect after the second baking results from fusing of ceramic particles to each other while the ceramic layers structure being sintered. On the other hand, ceramic particles in the green-form ceramic layers structure are bonded to each other by a resin material and those in the first baked ceramic layers structure are fused to each other only in tangential contact, whereby they are compatible with the sand blasting.

It is also a good idea that the abrasive particles for sand blasting are selected from materials which never remain as impurities after the second baking and that after making the through holes, the ceramic layers structure is modified in property by adding appropriate materials like ion implantation on a silicon wafer.

The baking temperature may be determined to meet specific requirements. For example, the ceramic layers structure after baked (at 600° C.) in the first baking step is processed for making electrodes and baked (at 800° C.) at the second baking step. As the second baking is higher in the baking temperature than the first baking, it is regarded as the main baking step. The matching between the first and second baking temperatures can minimize a difference in the shrinkage of the structure material between the two baking steps (or prevent a delamination fault).

For another example, the ceramic layers structure after baked (at 700° C.) in the first baking step it perforated, baked (at 900° C.) at the second baking step, processed with its perforated through holes being filled with an electrode material, and finally, baked (at 600° to 800° C.) for fusing the electrode material.

The laser cutting, as applicable in the embodiment, may be selected from YAG laser, carbon dioxide laser, excimer laser, etc. The laser cutting is advantageous in cutting the through holes in non-contact during the baking process.

In addition, the electrode material for filling the through holes may be distinguished from the electrode material embedded in the green-form ceramic layers structure. For example, the internal electrode material is preferably a specific silver palladium alloy which contains less palladium and more silver and thus is low in electric resistance but high in ion migration. On contrary, the external electrode material is selected from a different silver palladium alloy which contains more palladium and less silver and thus is high in electric resistence but low in ion migration.

Also, the internal electrode material comprises less a glass component and more a metal component for minimizing the shrinkage after baking, while the external electrode material to be supplied into the through holes comprises more a glass component and less a metal component for increasing the resistance to peel off or contains substances compatible with the soldering. Optimum materials for the internal and external electrodes can be selected independently.

It is also possible that the first and second baking steps and the perforating step are conducted in the oxidation atmosphere while the final baking step is carried out in the reducing atmosphere to reduce the oxidized electrode materials. As the electrode materials are exposed in the through holes, their oxide state can easily be reduced during the final baking.

Since the internal electrodes are exposed to through holes just before the external electrode material introduced to form the external electrodes, to connect them to the internal electrodes, and to connect the internal electrodes to each other, they have less chance to be oxidized and their electrical connection will be ensured. Also, the green-form ceramic layers structure is mainly processed on the ceramic substrate and its handling during the process will be less difficult.

It would be understood that the material for filling the through holes is not limited to the electrode materials described above. Different materials, e.g. a dielectric material and a magnetic material, may be applied to the through holes of the ceramic substrate and the ceramic layers structure respectively for particular specifications. For example, the through holes are filled with a magnetic material or the coil electrode space is filled with nothing for having desired coil frequency characteristics. Also, when the through holes remain unfilled, the separation to shapes will be facilitated or the baking of the green-form will be encouraged. If the internal electrodes remain exposed to the through holes, they can be used for characteristic change or various tests.

Although the methods of making the through holes described in the foregoing Examples all are suited for mass perforation, any conventional drilling or boring method may be used with equal success. Such a method is applicable to the lightly baked, not sintered, ceramic layers structure or its green form.

Although the external electrodes of Example 1 are formed by the through-hole printing, they may be produced by applying an external electrode material to the inner wall of the through holes using any applicable technique. The application of the external electrode material to the inner wall of the through holes may be executed after the ceramic layers structure is completed by baking its green form or after it (or its green form) is divided into shapes.

It is noted that the external electrodes are not necessarily formed in all the through holes but a desired number of the through holes only can be filled with the material using the through-hole printing for the purpose. Some of the internal electrodes may not be exposed to the through holes where the external electrode leads are not needed. When such the through holes where the internal electrodes are not exposed are filled with the material by the through-hole printing, they may be used as dummy external electrodes for giving an extra bonding strength (to prevent drop-off) when soldered to a circuit board.

The ceramic substrate may be replaced with a resin film or metal plate for increasing positional accuracy in the layer placing or printing and for use as toolings in the automatic operation. It is a good idea that the metal substrate is coated with a resin layer for prevention of any possible injury during the sand blasting or water jet cutting. Also, a belt shape of the substrate or base plate may be used for implementation of a continuous operation to increase the production efficiency.

As set forth above, according to the method of the present invention, the through holes are arranged in a ceramic layer structure placed on a substrate which has a plurality of aperture so that the through holes are seated on their corresponding apertures and the external electrodes are formed in the through holes. A resultant ceramic electronic device has a more area of permissible surface to accept any high density circuit design and will thus be minimized in dimensions.

The forming of the through holes can successfully be implemented in either green or low-temperature baked form of the ceramic layers structure. Since ceramic particles in the ceramic layers structure are matrix bound to one another with a resin binder in the green form or fused to one another only in tangential contact in the low-temperature baked or sintered form, the ceramic layers structure can easily be cut or ground by any applicable method contributing to the speed up of the operation (at etching velocity) and the minimization of unwanted processing faults (e.g. micro cracks and burrs).

What is claimed is:

1. A method of producing ceramic electrode devices comprising the steps of:

placing green-form ceramic layers encapsulating internal electrodes one over the other on a substrate which has a plurality of apertures therein so that the internal electrodes are aligned with corresponding apertures of the substrate, said green-form ceramic layers comprising a green sheet layer ceramic material;

making multiple through holes in a structure of the green-form ceramic layers through the apertures of the substrate using a sand blasting apparatus with abrasive particles prepared from the green sheet layer ceramic material;

forming in the through holes external electrodes connected to the internal electrodes; and baking the green-form ceramic layers structure.

2. A method of producing ceramic electrode devices comprising the steps of:

placing green-form ceramic layers encapsulating internal electrodes one over the other to form a first green-form ceramic layers structure on a surface of a substrate which has a plurality of apertures therein so that the internal electrodes are aligned with corresponding apertures of the substrate;

making multiple through holes in the first green-form ceramic layers structure through the apertures of the substrate;

forming in the through holes external electrodes connected to the internal electrodes;

baking the first green-form ceramic layers structure; and placing a second ceramic layers structure made mainly of a dielectric material containing lead on a surface of the substrate opposite to the surface containing the first ceramic layers structure made mainly of a ferrite material, said first ceramic layers structure and said second ceramic layers structure are electrically connected to each other by the external electrodes.

3. A method of producing ceramic electrode devices comprising the steps of:

placing green-form ceramic layers encapsulating internal electrodes one over the other on a substrate which has a plurality of apertures therein so that the internal electrodes are aligned with corresponding apertures of the substrate;

making multiple through holes in a structure of the green-form ceramic layers through the apertures of the substrate;

forming in the through holes external electrodes connected to the internal electrodes; and baking the green-form ceramic layers structure, wherein the green-form ceramic layers structure has in addition to the existing through holes extra through holes which are filled with a dielectric or magnetic material.

4. A method of producing ceramic electrode devices comprising the steps of:

placing green-form ceramic layers encapsulating internal electrodes one over the other on a substrate which has a plurality of apertures therein so that the internal electrodes are aligned with corresponding apertures of the substrate;

making multiple through holes in a structure of the green-form ceramic layers through the apertures of the substrate;

forming in the through holes external electrodes connected to the internal electrodes; and baking the green-form ceramic layers structure, wherein the green-form ceramic layers structure is bonded to the substrate by an adhesive layer of 0.1 to 500 μm thick.

* * * * *